(12) United States Patent
Dunn et al.

(10) Patent No.: US 10,757,844 B2
(45) Date of Patent: *Aug. 25, 2020

(54) SYSTEM AND METHOD FOR REDUCING OR COMBATING DISPLAY BOWING

(71) Applicant: Manufacturing Resources International, Inc., Alpharetta, GA (US)

(72) Inventors: William Dunn, Alpharetta, GA (US); Andrew Lincoln, Alpharetta, GA (US); Mike Brown, Cumming, GA (US); Marcos Diaz, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/502,515

(22) Filed: Jul. 3, 2019

(65) Prior Publication Data

US 2019/0327865 A1 Oct. 24, 2019

Related U.S. Application Data

(63) Continuation of application No. 15/964,258, filed on Apr. 27, 2018, now Pat. No. 10,398,066.

(Continued)

(51) Int. Cl.
*H05K 7/20* (2006.01)
*G02F 1/1333* (2006.01)
(Continued)

(52) U.S. Cl.
CPC ... *H05K 7/20972* (2013.01); *G02F 1/133308* (2013.01); *G02F 1/133385* (2013.01);
(Continued)

(58) Field of Classification Search
CPC .......... H05K 7/20972; H05K 7/20145; H05K 7/202; H05K 5/0213; F21V 29/00–85; G02F 1/133385
(Continued)

(56) References Cited

U.S. PATENT DOCUMENTS

| | | | |
|---|---|---|---|
| 4,093,355 | A | 6/1978 | Kaplit et al. |
| 4,593,978 | A | 6/1986 | Mourey et al. |

(Continued)

FOREIGN PATENT DOCUMENTS

| | | |
|---|---|---|
| AU | 2011248190 B2 | 5/2011 |
| AU | 2014287438 B2 | 1/2018 |

(Continued)

OTHER PUBLICATIONS

Mentley, David E., State of Flat-Panel Display Technology and Future Trends, Proceedings of the IEEE, Apr. 2002, vol. 90, No. 4, pp. 453-459.

(Continued)

*Primary Examiner* — Zachary Pape
(74) *Attorney, Agent, or Firm* — Standley Law Group LLP; Jeffrey S. Standley; Adam J. Smith

(57) ABSTRACT

An apparatus and method for reducing or combating bowing of an electronic display layer located behind a cover panel is provided. A rear panel is positioned behind the electronic display layer. An air pathway includes a first gas pathway between said cover panel and the electronic display layer, a cavity located between the electronic display layer and the rear panel, and a second gas pathway located behind the rear panel. The air pathway is configured to cause the pressure of air in the cavity to be lower than the pressure of air in the first gas pathway.

20 Claims, 17 Drawing Sheets

Related U.S. Application Data

(60) Provisional application No. 62/491,123, filed on Apr. 27, 2017.

(51) Int. Cl.
*G06F 1/16* (2006.01)
*G02F 1/13357* (2006.01)

(52) U.S. Cl.
CPC ...... *G02F 1/133603* (2013.01); *G06F 1/1601* (2013.01); *H05K 7/20963* (2013.01); *G02F 2001/133342* (2013.01); *G02F 2001/133628* (2013.01); *G02F 2201/36* (2013.01); *H05K 7/20145* (2013.01)

(58) Field of Classification Search
USPC ............... 361/679.49–679.51, 696; 454/184; 312/236; 362/373, 218, 269, 294; 349/161
See application file for complete search history.

(56) References Cited

U.S. PATENT DOCUMENTS

| | | | |
|---|---|---|---|
| 4,634,225 A | 1/1987 | Haim et al. | |
| 4,748,765 A | 6/1988 | Martin | |
| 4,763,993 A | 8/1988 | Vogeley et al. | |
| 4,921,041 A | 5/1990 | Akachi | |
| 4,952,783 A | 8/1990 | Aufderheide et al. | |
| 4,952,925 A | 8/1990 | Haastert | |
| 5,029,982 A | 7/1991 | Nash | |
| 5,088,806 A | 2/1992 | McCartney et al. | |
| 5,132,666 A | 7/1992 | Fahs | |
| 5,247,374 A | 9/1993 | Terada | |
| 5,282,114 A | 1/1994 | Stone | |
| 5,293,930 A | 3/1994 | Pitasi | |
| 5,351,176 A | 9/1994 | Smith et al. | |
| 5,432,526 A | 7/1995 | Hyatt | |
| 5,535,816 A | 7/1996 | Ishida | |
| 5,559,614 A | 9/1996 | Urbish et al. | |
| 5,621,614 A | 4/1997 | O'Neill | |
| 5,657,641 A | 8/1997 | Cunningham et al. | |
| 5,748,269 A | 5/1998 | Harris et al. | |
| 5,765,743 A | 6/1998 | Sakiura et al. | |
| 5,767,489 A | 6/1998 | Ferrier | |
| 5,808,418 A | 9/1998 | Pitman et al. | |
| 5,818,010 A | 10/1998 | McCann | |
| 5,818,694 A | 10/1998 | Daikoku et al. | |
| 5,835,179 A | 11/1998 | Yamanaka | |
| 5,864,465 A | 1/1999 | Liu | |
| 5,869,818 A | 2/1999 | Kim | |
| 5,869,919 A | 2/1999 | Sato et al. | |
| 5,903,433 A | 5/1999 | Gudmundsson | |
| 5,991,153 A * | 11/1999 | Heady .................... | H05K 7/202 165/185 |
| 6,003,015 A | 12/1999 | Kang et al. | |
| 6,007,205 A | 12/1999 | Fujimori | |
| 6,043,979 A | 3/2000 | Shim | |
| 6,089,751 A | 7/2000 | Conover et al. | |
| 6,104,451 A | 8/2000 | Matsuoka et al. | |
| 6,125,565 A | 10/2000 | Hillstrom | |
| 6,157,432 A | 12/2000 | Helbing | |
| 6,181,070 B1 | 1/2001 | Dunn et al. | |
| 6,191,839 B1 | 2/2001 | Briley et al. | |
| 6,198,222 B1 | 3/2001 | Chang | |
| 6,211,934 B1 | 4/2001 | Habing et al. | |
| 6,215,655 B1 | 4/2001 | Heady et al. | |
| 6,351,381 B1 | 2/2002 | Bilski et al. | |
| 6,359,390 B1 | 3/2002 | Nagai | |
| 6,392,727 B1 | 5/2002 | Larson et al. | |
| 6,417,900 B1 | 7/2002 | Shin et al. | |
| 6,428,198 B1 | 8/2002 | Saccomanno et al. | |
| 6,437,673 B1 | 8/2002 | Nishida et al. | |
| 6,473,150 B1 | 10/2002 | Takushima et al. | |
| 6,476,883 B1 | 11/2002 | Salimes et al. | |
| 6,493,440 B2 | 12/2002 | Gromatsky et al. | |
| 6,504,713 B1 | 1/2003 | Pandolfi et al. | |
| 6,535,266 B1 | 3/2003 | Nemeth et al. | |
| 6,628,355 B1 | 9/2003 | Takahara | |
| 6,643,130 B1 | 11/2003 | DeMarchis et al. | |
| 6,683,639 B2 | 1/2004 | Driessen-Olde Scheper et al. | |
| 6,701,143 B1 | 3/2004 | Dukach et al. | |
| 6,714,410 B2 | 3/2004 | Wellhofer | |
| 6,727,468 B1 | 4/2004 | Nemeth | |
| 6,742,583 B2 | 6/2004 | Tikka | |
| 6,812,851 B1 | 11/2004 | Dukach et al. | |
| 6,825,828 B2 | 11/2004 | Burke et al. | |
| 6,833,992 B2 | 12/2004 | Kusaka et al. | |
| 6,839,104 B2 | 1/2005 | Taniguchi et al. | |
| 6,850,209 B2 | 2/2005 | Mankins et al. | |
| 6,885,412 B2 | 4/2005 | Ohnishi et al. | |
| 6,886,942 B2 | 5/2005 | Okada et al. | |
| 6,891,135 B2 | 5/2005 | Pala et al. | |
| 6,909,486 B2 | 6/2005 | Wang et al. | |
| 6,943,768 B2 | 9/2005 | Cavanaugh et al. | |
| 6,961,108 B2 | 11/2005 | Wang et al. | |
| 7,015,470 B2 | 3/2006 | Faytlin et al. | |
| 7,059,757 B2 * | 6/2006 | Shimizu ............ | G02F 1/133308 362/235 |
| 7,083,285 B2 | 8/2006 | Hsu et al. | |
| 7,157,838 B2 | 1/2007 | Thielemans et al. | |
| 7,161,803 B1 | 1/2007 | Heady | |
| 7,190,416 B2 | 3/2007 | Paukshto et al. | |
| 7,190,587 B2 | 3/2007 | Kim et al. | |
| 7,209,349 B2 | 4/2007 | Chien et al. | |
| 7,212,403 B2 | 5/2007 | Rockenfeller | |
| 7,259,964 B2 | 8/2007 | Yamamura et al. | |
| 7,269,023 B2 | 9/2007 | Nagano | |
| 7,284,874 B2 | 10/2007 | Jeong et al. | |
| 7,396,145 B2 | 7/2008 | Wang et al. | |
| 7,452,121 B2 | 11/2008 | Cho et al. | |
| 7,457,113 B2 | 11/2008 | Kumhyr et al. | |
| 7,480,140 B2 | 1/2009 | Nara et al. | |
| 7,535,543 B2 | 5/2009 | Dewa et al. | |
| 7,591,508 B2 | 9/2009 | Chang | |
| 7,602,469 B2 | 10/2009 | Shin | |
| D608,775 S | 1/2010 | Leung | |
| 7,667,964 B2 | 2/2010 | Kang et al. | |
| 7,682,047 B2 | 3/2010 | Hsu et al. | |
| 7,752,858 B2 | 7/2010 | Johnson et al. | |
| 7,753,567 B2 | 7/2010 | Kang et al. | |
| 7,762,707 B2 | 7/2010 | Kim et al. | |
| 7,800,706 B2 | 9/2010 | Kim et al. | |
| 7,813,124 B2 | 10/2010 | Karppanen | |
| 7,903,416 B2 | 3/2011 | Chou | |
| 7,995,342 B2 | 8/2011 | Nakamichi et al. | |
| 8,004,648 B2 | 8/2011 | Dunn | |
| 8,035,968 B2 | 10/2011 | Kwon et al. | |
| 8,081,465 B2 | 12/2011 | Nishiura | |
| 8,102,173 B2 | 1/2012 | Merrow | |
| 8,142,027 B2 | 3/2012 | Sakai | |
| 8,208,115 B2 | 6/2012 | Dunn | |
| 8,223,311 B2 * | 7/2012 | Kim .................. | G02F 1/133385 349/161 |
| 8,241,573 B2 | 8/2012 | Banerjee et al. | |
| 8,248,784 B2 | 8/2012 | Nakamichi et al. | |
| 8,254,121 B2 | 8/2012 | Lee et al. | |
| 8,269,916 B2 | 9/2012 | Ohkawa | |
| 8,270,163 B2 | 9/2012 | Nakamichi et al. | |
| 8,274,622 B2 | 9/2012 | Dunn | |
| 8,274,789 B2 | 9/2012 | Nakamichi et al. | |
| 8,300,203 B2 | 10/2012 | Nakamichi et al. | |
| 8,310,824 B2 | 11/2012 | Dunn et al. | |
| 8,320,119 B2 | 11/2012 | Isoshima et al. | |
| 8,351,014 B2 | 1/2013 | Dunn | |
| 8,358,397 B2 | 1/2013 | Dunn | |
| 8,369,083 B2 | 2/2013 | Dunn et al. | |
| 8,373,841 B2 | 2/2013 | Dunn | |
| 8,379,182 B2 | 2/2013 | Dunn | |
| 8,400,608 B2 | 3/2013 | Takahashi et al. | |
| 8,472,174 B2 | 6/2013 | Idems et al. | |
| 8,472,191 B2 | 6/2013 | Yamamoto et al. | |
| 8,482,695 B2 | 7/2013 | Dunn | |
| 8,497,972 B2 | 7/2013 | Dunn et al. | |

(56) References Cited

U.S. PATENT DOCUMENTS

| | | | |
|---|---|---|---|
| 8,590,602 B2 | 11/2013 | Fernandez | |
| 8,649,170 B2 | 2/2014 | Dunn et al. | |
| 8,649,176 B2 | 2/2014 | Okada et al. | |
| 8,654,302 B2 | 2/2014 | Dunn et al. | |
| 8,678,603 B2 | 3/2014 | Zhang | |
| 8,693,185 B2 | 4/2014 | Dunn et al. | |
| 8,700,226 B2 | 4/2014 | Schuch et al. | |
| 8,711,321 B2 | 4/2014 | Dunn et al. | |
| 8,749,749 B2* | 6/2014 | Hubbard | G02F 1/133308 349/161 |
| 8,755,021 B2 | 6/2014 | Hubbard | |
| 8,758,144 B2 | 6/2014 | Williams et al. | |
| 8,760,613 B2 | 6/2014 | Dunn | |
| 8,767,165 B2 | 7/2014 | Dunn | |
| 8,773,633 B2 | 7/2014 | Dunn et al. | |
| 8,804,091 B2 | 8/2014 | Dunn et al. | |
| 8,823,916 B2 | 9/2014 | Hubbard et al. | |
| 8,827,472 B2 | 9/2014 | Takada | |
| 8,854,572 B2 | 10/2014 | Dunn | |
| 8,854,595 B2 | 10/2014 | Dunn | |
| 8,879,042 B2 | 11/2014 | Dunn | |
| 8,976,313 B2 | 3/2015 | Kim et al. | |
| 8,988,647 B2 | 3/2015 | Hubbard | |
| 9,030,641 B2 | 5/2015 | Dunn | |
| 9,089,079 B2 | 7/2015 | Dunn | |
| 9,119,325 B2 | 8/2015 | Dunn et al. | |
| 9,119,330 B2 | 8/2015 | Hubbard et al. | |
| 9,173,322 B2 | 10/2015 | Dunn | |
| 9,173,325 B2 | 10/2015 | Dunn | |
| 9,282,676 B1 | 3/2016 | Diaz | |
| 9,285,108 B2 | 3/2016 | Dunn et al. | |
| 9,313,917 B2 | 4/2016 | Dunn et al. | |
| 9,338,923 B2 | 5/2016 | Lee et al. | |
| 9,357,673 B2 | 5/2016 | Chin | |
| 9,370,127 B2 | 6/2016 | Dunn | |
| 9,414,516 B2 | 8/2016 | Chin et al. | |
| 9,448,569 B2 | 9/2016 | Schuch et al. | |
| 9,451,060 B1 | 9/2016 | Bowers et al. | |
| 9,451,733 B2 | 9/2016 | Dunn et al. | |
| 9,456,525 B2 | 9/2016 | Yoon et al. | |
| 9,470,924 B2 | 10/2016 | Dunn et al. | |
| 9,500,896 B2 | 11/2016 | Dunn et al. | |
| 9,516,485 B1 | 12/2016 | Bowers et al. | |
| 9,549,490 B2 | 1/2017 | Hubbard | |
| 9,594,271 B2 | 3/2017 | Dunn et al. | |
| 9,613,548 B2 | 4/2017 | DeMars | |
| 9,622,392 B1 | 4/2017 | Bowers et al. | |
| 9,629,287 B2 | 4/2017 | Dunn | |
| 9,648,790 B2 | 5/2017 | Dunn et al. | |
| 9,655,289 B2 | 5/2017 | Dunn et al. | |
| 9,703,230 B2 | 7/2017 | Bowers et al. | |
| 9,723,765 B2 | 8/2017 | DeMars | |
| 9,743,553 B2 | 8/2017 | Kim et al. | |
| 9,797,588 B2 | 10/2017 | Dunn et al. | |
| 9,801,305 B2 | 10/2017 | Dunn et al. | |
| 9,823,690 B2 | 11/2017 | Bowers et al. | |
| 9,835,893 B2 | 12/2017 | Dunn | |
| 9,861,007 B2 | 1/2018 | Yoon et al. | |
| 9,894,800 B2 | 2/2018 | Dunn | |
| 10,080,316 B2 | 9/2018 | Dunn et al. | |
| 10,088,702 B2 | 10/2018 | Dunn et al. | |
| 10,180,591 B2 | 1/2019 | Lee et al. | |
| 10,194,564 B2 | 1/2019 | Dunn et al. | |
| 10,212,845 B2 | 2/2019 | Dunn et al. | |
| 10,278,311 B2 | 4/2019 | DeMars | |
| 10,306,781 B2 | 5/2019 | Cho et al. | |
| 10,314,212 B2 | 6/2019 | Hubbard | |
| 10,359,817 B2 | 7/2019 | Yun et al. | |
| 10,383,238 B2 | 8/2019 | Yun et al. | |
| 10,398,066 B2* | 8/2019 | Dunn | G02F 1/133385 |
| 10,485,147 B2 | 11/2019 | Oh et al. | |
| 10,485,148 B2 | 11/2019 | Oh et al. | |
| 2001/0001459 A1 | 5/2001 | Savant et al. | |
| 2001/0019454 A1 | 9/2001 | Tadic-Galeb et al. | |
| 2001/0032404 A1 | 10/2001 | Hillstrom | |
| 2002/0009978 A1 | 1/2002 | Dukach et al. | |
| 2002/0033919 A1 | 3/2002 | Sanelle et al. | |
| 2002/0050793 A1 | 5/2002 | Cull et al. | |
| 2002/0065046 A1 | 5/2002 | Mankins et al. | |
| 2002/0084891 A1 | 7/2002 | Mankins et al. | |
| 2002/0101553 A1 | 8/2002 | Enomoto et al. | |
| 2002/0112026 A1 | 8/2002 | Fridman et al. | |
| 2002/0126248 A1 | 9/2002 | Yoshia | |
| 2002/0148600 A1 | 10/2002 | Bosch et al. | |
| 2002/0149714 A1 | 10/2002 | Anderson et al. | |
| 2002/0154255 A1 | 10/2002 | Gromatzky et al. | |
| 2002/0164944 A1 | 11/2002 | Haglid | |
| 2002/0164962 A1 | 11/2002 | Mankins et al. | |
| 2002/0167637 A1 | 11/2002 | Burke et al. | |
| 2003/0007109 A1 | 1/2003 | Park | |
| 2003/0020884 A1 | 1/2003 | Okada et al. | |
| 2003/0043091 A1 | 3/2003 | Takeuchi et al. | |
| 2003/0104210 A1 | 6/2003 | Azumi et al. | |
| 2003/0128511 A1 | 7/2003 | Nagashima et al. | |
| 2003/0214785 A1 | 11/2003 | Perazzo | |
| 2004/0012722 A1 | 1/2004 | Alvarez | |
| 2004/0035032 A1 | 2/2004 | Milliken | |
| 2004/0035558 A1 | 2/2004 | Todd et al. | |
| 2004/0036622 A1 | 2/2004 | Dukach et al. | |
| 2004/0036834 A1 | 2/2004 | Ohnishi et al. | |
| 2004/0042174 A1 | 3/2004 | Tomioka et al. | |
| 2004/0103570 A1 | 6/2004 | Ruttenberg | |
| 2004/0105159 A1 | 6/2004 | Saccomanno et al. | |
| 2004/0135482 A1 | 7/2004 | Thielemans et al. | |
| 2004/0165139 A1 | 8/2004 | Anderson et al. | |
| 2004/0223299 A1 | 11/2004 | Ghosh | |
| 2005/0012039 A1 | 1/2005 | Faytlin et al. | |
| 2005/0012722 A1 | 1/2005 | Chon | |
| 2005/0062373 A1 | 3/2005 | Kim et al. | |
| 2005/0073632 A1 | 4/2005 | Dunn et al. | |
| 2005/0073639 A1 | 4/2005 | Pan | |
| 2005/0127796 A1 | 6/2005 | Olesen et al. | |
| 2005/0134525 A1 | 6/2005 | Tanghe et al. | |
| 2005/0134526 A1 | 6/2005 | Willem et al. | |
| 2005/0213950 A1 | 9/2005 | Yoshimura | |
| 2005/0229630 A1 | 10/2005 | Richter et al. | |
| 2005/0237714 A1 | 10/2005 | Ebermann | |
| 2005/0253699 A1 | 11/2005 | Madonia | |
| 2005/0276053 A1 | 12/2005 | Nortrup et al. | |
| 2005/0286131 A1 | 12/2005 | Saxena et al. | |
| 2006/0012958 A1 | 1/2006 | Tomioka et al. | |
| 2006/0012985 A1 | 1/2006 | Archie, Jr. et al. | |
| 2006/0018093 A1 | 1/2006 | Lai et al. | |
| 2006/0034051 A1 | 2/2006 | Wang et al. | |
| 2006/0056994 A1 | 3/2006 | Van Lear et al. | |
| 2006/0082271 A1 | 4/2006 | Lee et al. | |
| 2006/0092348 A1 | 5/2006 | Park | |
| 2006/0125998 A1 | 6/2006 | Dewa et al. | |
| 2006/0132699 A1 | 6/2006 | Cho et al. | |
| 2006/0177587 A1 | 8/2006 | Ishizuka et al. | |
| 2006/0199514 A1 | 9/2006 | Kimura | |
| 2006/0209266 A1 | 9/2006 | Utsunomiya | |
| 2006/0260790 A1 | 11/2006 | Theno et al. | |
| 2006/0262079 A1 | 11/2006 | Seong et al. | |
| 2006/0266499 A1 | 11/2006 | Choi et al. | |
| 2006/0269216 A1 | 11/2006 | Wiemeyer et al. | |
| 2006/0283579 A1 | 12/2006 | Ghosh et al. | |
| 2007/0013647 A1 | 1/2007 | Lee et al. | |
| 2007/0019419 A1 | 1/2007 | Hafuka et al. | |
| 2007/0030879 A1 | 2/2007 | Hatta | |
| 2007/0047239 A1 | 3/2007 | Kang et al. | |
| 2007/0065091 A1 | 3/2007 | Hinata et al. | |
| 2007/0076431 A1 | 4/2007 | Atarashi et al. | |
| 2007/0081344 A1 | 4/2007 | Cappaert et al. | |
| 2007/0103863 A1 | 5/2007 | Kim | |
| 2007/0103866 A1 | 5/2007 | Park | |
| 2007/0115686 A1 | 5/2007 | Tyberghien | |
| 2007/0139929 A1 | 6/2007 | Yoo et al. | |
| 2007/0140671 A1 | 6/2007 | Yoshimura | |
| 2007/0144704 A1 | 6/2007 | Bundza et al. | |
| 2007/0151274 A1 | 7/2007 | Roche et al. | |
| 2007/0151664 A1 | 7/2007 | Shin | |
| 2007/0171353 A1 | 7/2007 | Hong | |
| 2007/0206158 A1 | 9/2007 | Kinoshita et al. | |

(56) References Cited

U.S. PATENT DOCUMENTS

| | | |
|---|---|---|
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0035315 A1 | 2/2008 | Han |
| 2008/0054144 A1 | 3/2008 | Wohlford |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0051071 A1 | 3/2011 | Nakamichi et al. |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0188481 A1 | 7/2012 | Kang et al. |
| 2012/0206687 A1 | 8/2012 | Dunn et al. |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0268657 A1 | 9/2014 | Dunn et al. |
| 2014/0313698 A1 | 10/2014 | Dunn et al. |
| 2014/0314395 A1 | 10/2014 | Dunn et al. |
| 2014/0361138 A1 | 12/2014 | Ramirez et al. |
| 2015/0009627 A1 | 1/2015 | Dunn et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2016/0041423 A1 | 2/2016 | Dunn |
| 2016/0044829 A1 | 2/2016 | Dunn |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0175411 A1 | 6/2017 | Bowers et al. |
| 2017/0188490 A1 | 6/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0042134 A1 | 2/2018 | Dunn et al. |
| 2018/0088368 A1 | 3/2018 | Notoshi et al. |
| 2018/0116073 A1 | 4/2018 | Dunn |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0037738 A1 | 1/2019 | Dunn et al. |
| 2019/0089176 A1 | 3/2019 | Dunn et al. |
| 2019/0133002 A1 | 5/2019 | Dunn et al. |
| 2019/0208674 A1 | 7/2019 | Demars |

(56) References Cited

U.S. PATENT DOCUMENTS

FOREIGN PATENT DOCUMENTS

| | | |
|---|---|---|
| AU | 2015253128 B2 | 3/2018 |
| AU | 2017216500 B2 | 10/2018 |
| AU | 2017216500 B2 | 1/2019 |
| AU | 2015229457 B2 | 3/2019 |
| AU | 2016220308 B2 | 3/2019 |
| BR | PI0820231-1 | 2/2019 |
| CA | 2705814 C | 2/2018 |
| CA | 2947524 C | 4/2018 |
| CA | 2915261 C | 8/2018 |
| CA | 2809019 C | 9/2019 |
| CN | 2702363 Y | 5/2005 |
| CN | 107251671 A | 10/2017 |
| CN | 108700739 A | 10/2018 |
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3117693 A2 | 1/2017 |
| EP | 3259968 A1 | 12/2017 |
| EP | 3423886 | 1/2019 |
| EP | 3468321 A1 | 4/2019 |
| EP | 3138372 B1 | 5/2019 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | 8115788 A | 5/1996 |
| JP | 8194437 A | 7/1996 |
| JP | H08-305301 A | 11/1996 |
| JP | 8339034 A | 12/1996 |
| JP | H09246766 A | 9/1997 |
| JP | 11160727 A | 6/1999 |
| JP | H11296094 A | 10/1999 |
| JP | 2000-10501 A | 1/2000 |
| JP | 2001209126 A | 8/2001 |
| JP | 2002158475 A | 5/2002 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2006176112 A | 7/2006 |
| JP | 2007003638 A | 1/2007 |
| JP | 2007-293105 A | 11/2007 |
| JP | 09307257 A | 11/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-503663 A | 1/2011 |
| JP | 2011-75819 A | 4/2011 |
| JP | 2012-133254 A | 7/2012 |
| JP | 2013-537721 A | 10/2013 |
| JP | 2014-225595 A | 12/2014 |
| JP | 2017518526 A | 7/2017 |
| JP | 2018-511838 A | 4/2018 |
| JP | 6305564 B2 | 4/2018 |
| JP | 2019-512721 A | 5/2019 |
| KR | 20000000118 U | 1/2000 |
| KR | 20000047899 A | 7/2000 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 10-2006-0070176 A | 6/2006 |
| KR | 100666961 B1 | 1/2007 |
| KR | 1020070070675 A | 4/2007 |
| KR | 1020070048294 | 8/2007 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| RU | 2513043 C2 | 4/2014 |
| WO | WO2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | WO2015168375 A1 | 11/2015 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |

OTHER PUBLICATIONS

Rohsenow, Warren M., Handbook of Heat Transfer, Third Edition, 1998, select chapters, 112 pages, McGraw-Hill.

The American Heritage College Dictionary, Third Edition, 1993, excerpt, 3 pages, Houghton Mifflin Company.

*Civiq Smartscapes LLC.* v *Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.

*Civiq Smartscapes LLC.* v *Manufacturing Resources International, Inc.*, Defendant's Amended Answer and Counterclaims to Plaintiffs First Amended Complaint, Filed Apr. 24, 2018, 240 pages.

Itsenclosures, Product Catalog, 2009, 48 pages.

Itsenclosures, Standard Product Data Sheet, 2011, 18 pages.

SunbriteTV, All Weather Outdoor LCD Television Model 4610HD, 2008, 1 page.

SunbriteTV, Introduces Two New All-Weather Outdoor Televisions InfoComm 2008, 7 pages.

Itsenclosures, Viewstation, 2017, 16 pages.

Novitsky, Driving LEDs versus CCFLs for LCD backlighting, Nov. 12, 2007, 6 pages.

Federman, Cooling Flat Panel Displays, 2011, 4 pages.

Zeeff, T.M., EMC analysis of an 18" LCD monitor, 2000, 1 page.

Vertigo Digital Displays, FlexVu Totem Shelter, 2017, 2 pages.

Vertigo Digital Displays, All Products Catalogue, 2017, 14 pages.

Adnation, Turn Key Advertising Technology Solutions, May 23, 2017, 4 pages.

(56) References Cited

OTHER PUBLICATIONS

Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A—Appendix D, Jan. 24, 2018, 51 pages.
Civiq, Invalidity Contentions, Jan. 24, 2018, 51 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC* v. *Manufacturing Resources International, Inc.*, Memorandum Opinion re claim construction, Sep. 27, 2018, 16 pages.
*Civiq Smartscapes, LLC* v. *Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.

\* cited by examiner

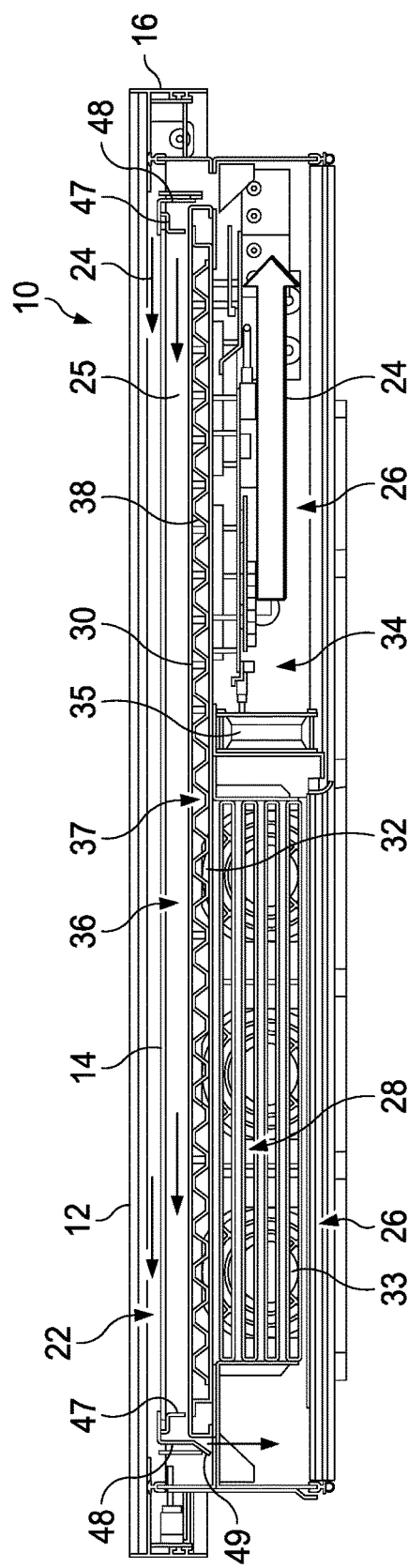
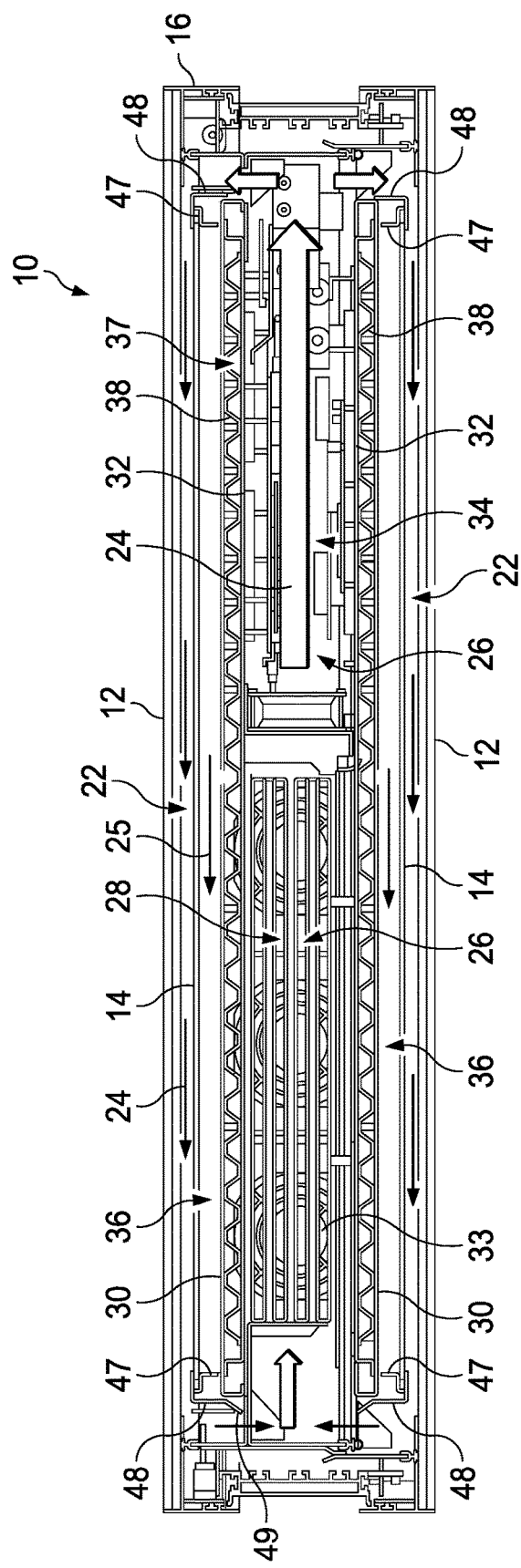
FIG. 2
FIG. 3

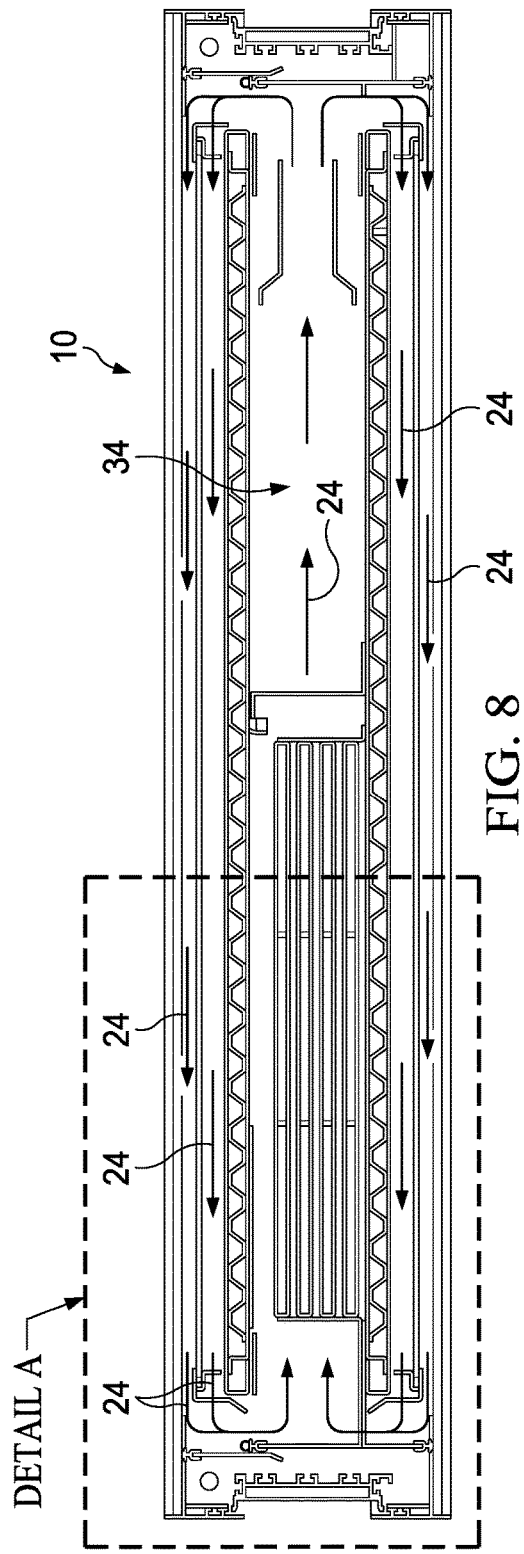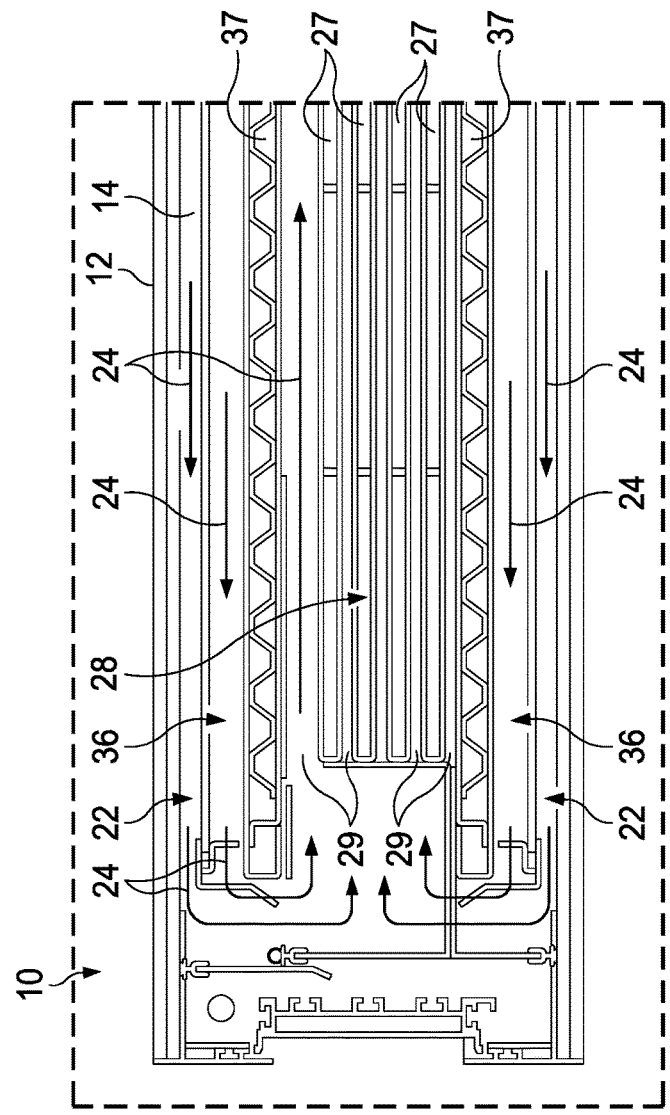

SYSTEM AND METHOD FOR REDUCING OR COMBATING DISPLAY BOWING

CROSS-REFERENCE TO RELATED APPLICATION

This application is a continuation of U.S. non-provisional patent application Ser. No. 15/964,258 filed Apr. 27, 2018, which claims the benefit of U.S. provisional patent application Ser. No. 62/491,123 filed Apr. 27, 2017, the disclosures of all of which are hereby incorporated by reference in their entireties.

TECHNICAL FIELD

Exemplary embodiments of the present invention relate generally to assemblies for electronic displays.

BACKGROUND AND SUMMARY OF THE INVENTION

Electronic displays have grown in popularity not only for indoor use, but also for outdoor use. One exemplary application, without limitation, is the digital out of home market where the electronic displays are increasingly replacing the use of static posters. The use of electronic displays is advantageous because they allow images to be changed quickly as well as permit the use videos and interactive displays, among other benefits. Such displays may be used for advertisements, public announcements, information, wayfinding, and the like.

Such outdoor, and some indoor, displays are sometimes encased in a housing to protect them from environmental conditions. The housing may be designed to resist, mitigate, manage, control, or prevent water, precipitation, dust, and air contaminant intrusion, vandalism, tampering, wind, temperature changes, solar loading, extreme temperatures, and the like. Oftentimes, these displays are placed outdoors where they are subject to extreme temperatures, drastic temperature changes, and significant solar loading. If the temperature inside the housing gets too high or too low the electronic displays and related components may be damaged. As such, the temperature inside the housing must be maintained at acceptable levels. In order to maintain the temperature inside the housings at acceptable levels, a number of gas pathways are generally placed through the housing. Sometimes, a combination of open loops carrying ambient air and closed loops carrying circulating gas are used.

Over time, the market has demanded increasingly larger displays. These larger displays have correspondingly larger surface areas and often require correspondingly larger, in size or number, gas pathways to maintain the temperature in the housing. As the dimensions of these displays and corresponding gas pathways have increased, the potential for the displays to bow outwardly has increased. This is because, typically, the displays are mostly unsupported. The displays are generally mounted along their perimeter so illumination from the backlight is permitted to reach the entirety of the display, among other considerations. Thus, a large section of the display is not directly mounted to a housing or other stabilizing or supporting structure, which may allow bowing of the display. Additionally, the asymmetrical temperature loading of various layers and components of the display may contribute to such display bowing. Further still, some displays have a gap between the electronic display itself and a cover panel located in front of the electronic display. As the electronic display bows towards the cover panel, the gap between the cover panel and the display may be narrowed and a resulting venturi effect may be created. The venturi effect may increase the bowing forces.

Such bowing can cause damage to the display, distortion of the displayed image, and may disrupt airflow through the open and closed loops. In some cases, the electronic display may bow outwardly enough that it contacts the cover panel. This may not only interrupt normal thermal management but may also result in significant heat transfer from the solar loaded cover panel to the electronic display. This may rapidly cause permanent damage to the display. Therefore, what is needed is a system and method for reducing or combating bow in an electronic display.

Additionally, display assemblies comprising a backlight sometimes have a sealed cavity for the backlight. As the illumination devices and other components of the backlight generate heat, heat can become trapped in this cavity. Because the cavity may be completely or partially sealed, the heat may build up and cause damage to components of the assembly. Therefore, what is needed is a system and method for removing heat from the backlight cavity.

The present invention is a system and method for reducing or combating bow in an electronic display. The present invention is also a system and method for removing heat from the backlight cavity. The present invention provides a first gas pathway through first gas pathways between a cover panel and an electronic display and an additional flow path through a backlight cavity located in the space between the electronic display and a backlight. The flow of air through the backlight cavity removes heat from the backlight cavity generated by the illumination devices or other components.

The amount or speed of airflow through the first gas pathway and the backlight cavity may be controlled so as to create a pressure drop in the backlight cavity as compared to the first gas pathway. This pressure drop may result in forces which tend to pull the electronic display away from the cover panel, thereby reducing or eliminating the bowing. In particular, a support or a bracket may be used to create an entrance gap and exit gap into and out of the backlight cavity. In this way the amount or speed of airflow through the backlight cavity may be controlled. The entrance gap may be smaller than the exit gap. In exemplary embodiments, an angled section may extend from the distal end of the bracket located near the exit gap. The angled section may extend towards the side of the housing to restrict the flow of air from the first gas pathway into a second gas pathway located behind the backlight. The constriction of this air may create a venturi effect, creating a low-pressure zone near the angled section to pull circulating gas through the backlight cavity.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 2 is a top sectional view of an exemplary display assembly embodiment taken along section line A-A of FIG. 1;

FIG. 3 is a top sectional view of another exemplary display assembly embodiment taken along section line A-A of FIG. 1;

FIG. 8 is a top sectional view taken along section line B-B of FIG. 7B also indicating detail A;

FIG. 9 is a detailed top sectional view of Detail A of FIG. 8;

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Figure 1:
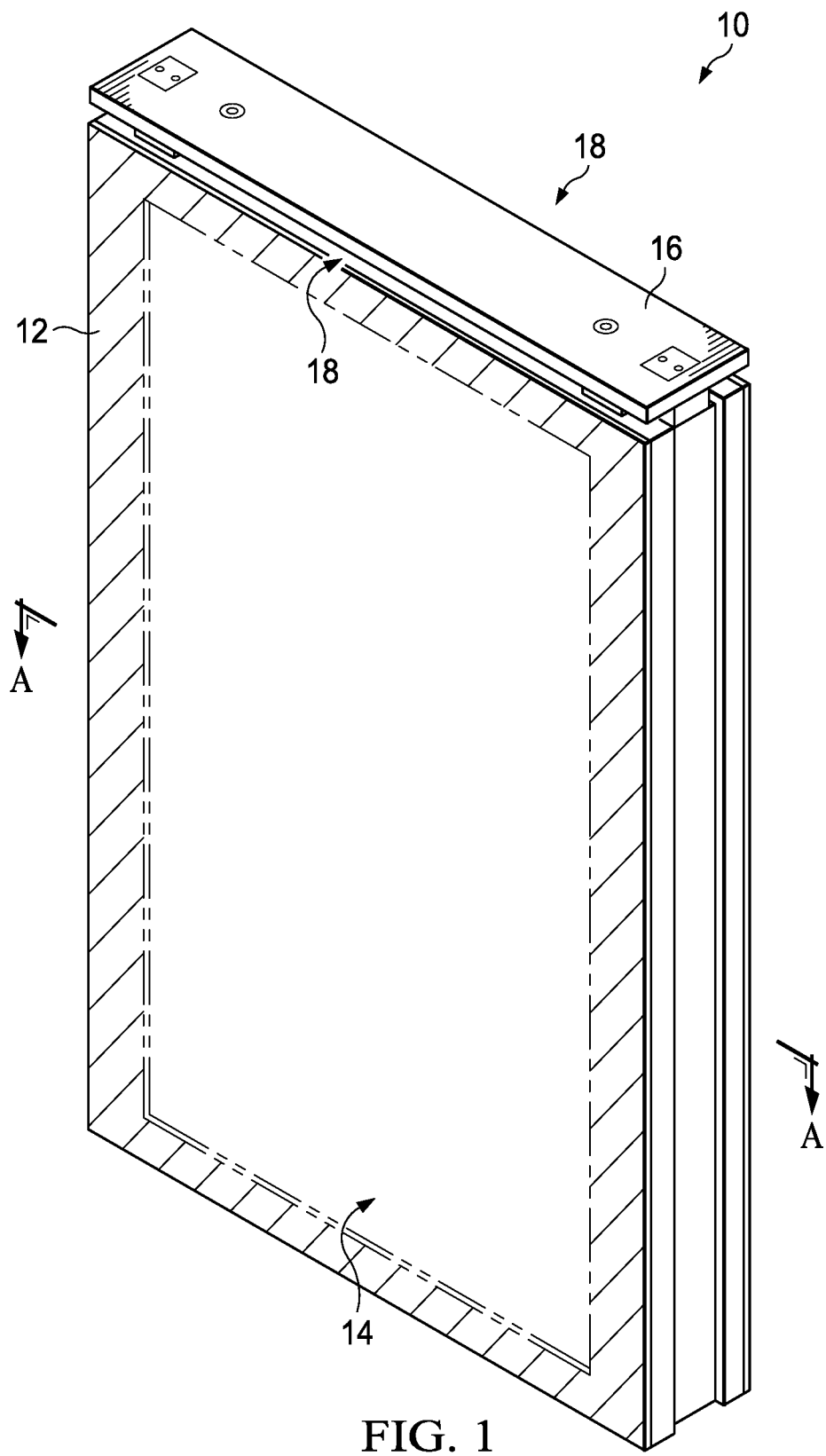
FIG. 1 is a perspective view of an exemplary display assembly in accordance with the present invention also indicating section lines A-A.

FIG. 1 is a perspective view of an exemplary display assembly 10 in accordance with the present invention also indicating section line A-A. The display assembly 10 may comprise an electronic display 14 located in a housing 16. In exemplary embodiments, the electronic display 14 is a liquid crystal display (LCD). However, any type of electronic display 14 may be used, such as but not limited to, a LCD, light emitting diode (LED) display, organic LED display, plasma display, or the like. The electronic display 14 may optionally comprise one or more diffuser sheets or optical films. A cover panel 12 may be located in front of the electronic display 14. The cover panel 12 may be located substantially parallel to, spaced apart from, and in front of the electronic display 14. The cover panel 12 may form the front surface of the housing 16. The cover panel 12 may be comprised or a transparent or translucent material such as, but not limited to, a glass or acrylic. The cover panel 12 may be comprised or multiple layers. As will be shown and described in greater detail herein, one or more electronic displays 14 and corresponding components may be used, including but not limited to, a pair of electronic displays 14 placed back to back within the housing 16. Regardless, an intake 18 may extend along either side or the upper portion of the housing 16, though any location is contemplated. As will be shown and described in greater detail herein, an exhaust 20 may be located along the lower edge of the display assembly 10, though any location is contemplated.

FIG. 2 is a top section view taken along section line A-A of FIG. 1 illustrating an exemplary display assembly 10 using a single electronic display 14. A backlight 30 may be located behind the electronic display. The backlight 30 may be located behind, substantially parallel to, and spaced apart from, the electronic display 14. The backlight 30 may comprise a number of illumination devices, such as but not limited to light emitting diodes (LEDs), located on a pan. In exemplary embodiments, the backlight 30 may comprise a number of illumination devices arranged in a spaced pattern to provide a directly backlit arrangement. In other exemplary embodiments, the backlight 30 may comprise a number of illumination devices arranged in a line along one or more sides of the electronic display 14 in an edge lit arrangements. In still other exemplary embodiments, the backlight 30 may form a part of the electronic display 14, such as without limitation with an organic LED display. In such embodiments, a backlight pan may be located behind the electronic display 14. The backlight pan may be a metal sheet or the like.

Regardless, a rear plate 32 may be located behind the backlight 30. The rear plate 32 may be located behind, spaced apart from, and substantially parallel to the backlight 30. A first gas pathway 22 may be located in the space between the rear surface of the cover panel 12 and the front surface of the electronic display 14. This space may also be referred to as the LCD cavity herein. The first gas pathway 22 may be configured to receive circulating gas 24. The circulating gas 24 may travel through the first gas pathway 22 and into a second gas pathway 26 located behind the backlight 30.

The second gas pathway 26 may be located in the space between the rear plate 32 and the rear of the housing 16. The second gas pathway 26 may comprise a heat exchanger 28 and an electronics cavity 30, though such is not required. The heat exchanger 28 may be any type of heat exchanger 28. The heat exchanger 28 may be mounted to the rear plate 32, though any location is contemplated. In exemplary embodiments, the heat exchanger 28 occupies a first portion of the second gas pathway 26 and the electronics cavity 34 occupies a second portion where various electronic components may be located. The heat exchanger 28 may also be part of a second open loop pathway. These various electronic components may be used to operate the display assembly 10. After traveling through the second gas pathway 26, the circulating gas 24 may return to the first gas pathway 22, thus creating a closed loop. Stated another way, the closed loop may encircle the electronic display 14. One or more closed loop fans 35 may be placed along the closed loop so as to control the speed and amount of circulating gas 24 pass through the closed loop, or through the first gas pathway 22 or the second gas pathway 26. In exemplary embodiments, the closed loop fan 35 may be located between the heat exchanger 28 and the electronics cavity 34, though any location is contemplated.

In exemplary embodiments, a corrugation layer 38 may be located between the rear surface of the backlight 30 and the front surface of the rear plate 32. The corrugation layer 38 may be configured to receive ambient air 44. The space between the rear plate 32 and the backlight 30 may define a first open loop channel 37. The ambient air 44 may also flow through the heat exchanger 28 (the second open loop pathway). Ambient air 44 may enter the assembly 10, pass through the first or second open loop pathways and then exit the assembly 10, thus creating an open loop. One or more open loop fans 33 may be placed along the open loop to control the amount or speed of ambient air 44 flowing through the open loop, or through the corrugation layer 38 or the heat exchanger 28.

A backlight cavity 36 may be located in the space between the rear surface of the electronic display 14 and the front surface of the backlight 30. A portion of the circulating gas 24 may be separated from the remainder of the circulating gas 24 and travel into or through the backlight cavity 36. This portion of the circulating gas 24 may also be referred to herein as the backlight cavity gas 25. The backlight cavity gas 25 that exits the backlight cavity 36 may be rejoined with the circulating gas 24. The backlight cavity 36 may be framed on the sides, at least in part, by supports 47. In exemplary embodiments, a first supports 47 is located on the side of the backlight cavity 36 which receives the backlight cavity gas 25 and a second support 47 is located on the side of the backlight cavity 36 where the backlight cavity gas 25 exits the backlight cavity 36.

The supports 47 may extend from the rear surface of the electronic display 14 to support various components, such as but not limited to, a diffuser, optical films, a transparent sheet, or the like, located between the electronic display 14 and the backlight 30. The supports 47 may be spaced apart from the backlight 30 or the electronic display 14 at one or more locations to define an entrance gap and an exit gap for the backlight cavity gas 25 to enter or exit the backlight cavity 36, respectively. In other exemplary embodiments, the supports 47 may comprise a number of aperture which define the entrance gap and the exit gap. As will be explained in greater detail herein, the backlight cavity gas 25 may be maintained at a lower pressure relative to the circulating gas 24 traveling through the first gas pathway 22, though such is not required.

In exemplary embodiments, the pressure of the backlight cavity gas 25 may be kept relatively low by controlling the amount or speed of the backlight cavity gas 25 permitted to enter and exit the backlight cavity 36. The amount or speed of the backlight cavity gas 25 may be controlled, at least in part, by the dimensions and/or shape of the backlight cavity 36. In exemplary embodiments, the gap between the supports 47 and the front surface of the backlight 30 may be sized and configured to control the amount or speed of the backlight cavity gas 25 allowed to enter and exit the backlight cavity 36. In exemplary embodiments, the gap between the support 47 located at the entrance to the backlight cavity 36 may be smaller than the gap between the support 47 located at the exit of the backlight cavity 36 to reduce the pressure of the backlight cavity gas 25.

Alternatively, or in addition, the amount or speed of air permitted to enter and exit the backlight cavity 36 may be controlled by brackets 48. In exemplary embodiments, a first bracket 48 is located on the side of the backlight cavity 36 which receives the backlight cavity gas 25 and a second bracket 48 is located on the side of the backlight cavity 36 where the backlight cavity gas 25 exits the backlight cavity 36. The brackets 48 may be substantially shaped as an upside-down "L" and may extend from either edge of the electronic display 14 so as to also frame the backlight cavity 36. The gap between the bracket 48 and the surrounding structure, including but not limited to, the backlight 30 and the corrugation layer 38, may be sized and configured to control the amount or speed of the backlight cavity gas 25 allowed to enter and exit the backlight cavity 36. In exemplary embodiments, the gap between the bracket 48 located at the entrance to the backlight cavity 36 may be smaller than the gap between the bracket 48 located at the exit of the backlight cavity 36 to reduce the pressure of the backlight cavity gas 25.

In exemplary embodiments, some or all of the brackets 48 may comprise an angled section 49 extending from an end thereof. This angled section 49 may be angled, oriented, sized, shaped, and otherwise configured to likewise to control the amount or speed of the backlight cavity gas 25 allowed to enter and exit the backlight cavity 36. In exemplary embodiments, the angled section 49 may only be located on the exit of the backlight cavity 36 to assist in reducing the pressure of the backlight cavity gas 25.

In exemplary embodiments, the angled section 49 may extend towards the side of the housing. The angled section 49 may extend into the flow of circulating gas 24 passing from the first gas pathway 22 into the second gas pathway 26. The angled section 49 may disrupt a portion of such flow and instead permit said backlight cavity gas 25 to rejoin the remainder of the circulating gas 26. As the angled section 49 may restrict the flow of circulating gas 24 passing from the first gas pathway 22 into the second gas pathway 26, the angled section 49 may create a venturi effect and result in a lower pressure area near the exit of the backlight cavity 36. This lower pressure area may force or encourage the backlight cavity gas 25 to enter, flow through, and exit the backlight cavity 36. This may affect the relatively pressure of the backlight cavity gas 25 and the resulting forces on the electronic display 14. The angle of the angled section 49 may be engineered and adjusted to provide a desirable flow through the backlight cavity 36 and resulting force on the electronic display 14.

The amount or speed of the circulating gas 24 permitted to enter and exit the backlight cavity 38 (the backlight cavity gas 25) may be predetermined to account for anticipated bowing of the electronic display 14. Indeed, the amount or speed of the backlight cavity gas 25 may determine the pressure of the backlight cavity gas 25, and thus the resulting force on the electronic display 14. For example, without limitation, enough resulting force may be desirable to substantially cancel out the bowing of the electronic display 14. However, too much resulting force may compress the electronic display 14, resulting in image distortion and/or damage to the electronic display 14. In exemplary embodiments, a pressure difference between 0-0.5 psi between the circulating gas 24 flowing through the first gas pathway 22 and the backlight cavity gas 25 may be desirable, though any relative pressures are contemplated. For example, without limitation, the supports 47, the brackets 48, and the angled section 49 may be sized to create a predetermined relative pressure drop. Similarly, the angle of the angled section 49 may be selected to create a predetermined relative pressure drop. It is contemplated that other control devices may be used to control the amount or speed of the backlight cavity gas 25 such as, without limitation, fans, structural obstructions, diffusers, filters, throttles, valves, flow splitters, or the like.

FIG. 3 is a top sectional view of another exemplary display assembly 10 embodiment taken along section line A-A of FIG. 1. The display assembly 10 illustrated and described with respect to FIG. 3 is similar to the display assembly 10 illustrated with respect to FIG. 2 with the addition of a second electronic display 14 placed back to back with the first electronic display 14. Related components for the second electronic display, such as but not limited to, a second cover panel 12, a second backlight cavity 36, may likewise be placed back to back with the first electronic display 14. In this embodiment, the circulating gas 24 may separate after traveling through the second gas pathway 26 such that a portion flows in front of each electronic display 14. Similarly, a portion of the circulating gas 24 may be separated and may flow as backlight cavity gas 25 through each respective backlight cavity 36. The circulating gas 24 flowing in front of each of the respective electronic display 14 may be rejoined at the other end of the first gas pathway 22 and flow through the second gas pathway 26. In such embodiments, the second gas pathway 26 may share a common heat exchanger 28, electronics, electronics cavity 34, and other related components, though such is not required. It is contemplated that separate closed loop pathways may instead be utilized. It is further contemplated that additional electronic displays 14 in various locations are contemplated.

Figure 4:
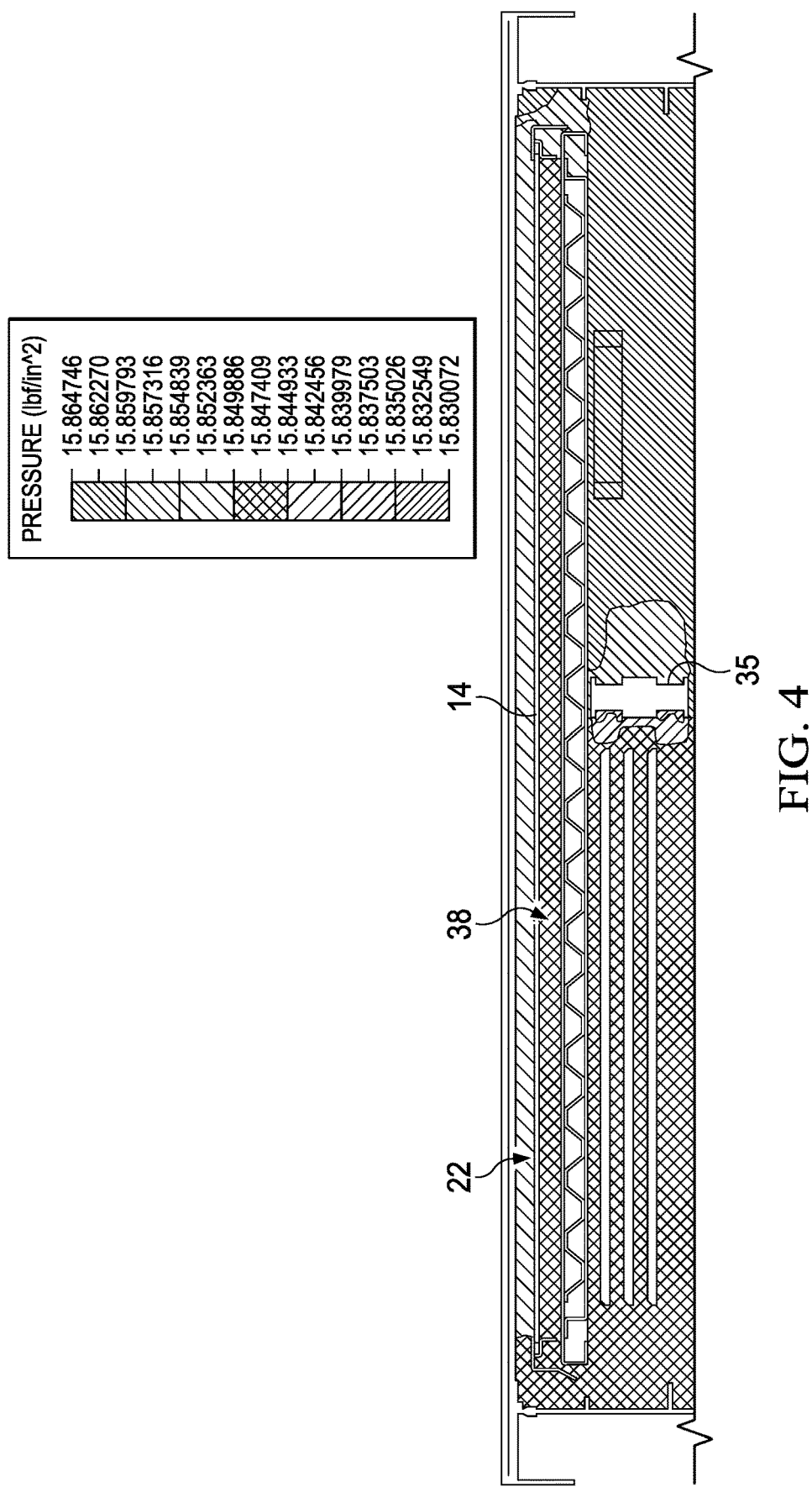
FIG. 4 is a top section view similar to FIG. 2 illustrating an exemplary pressure analysis where the display bowing is reduced or eliminated.
Figure 5:
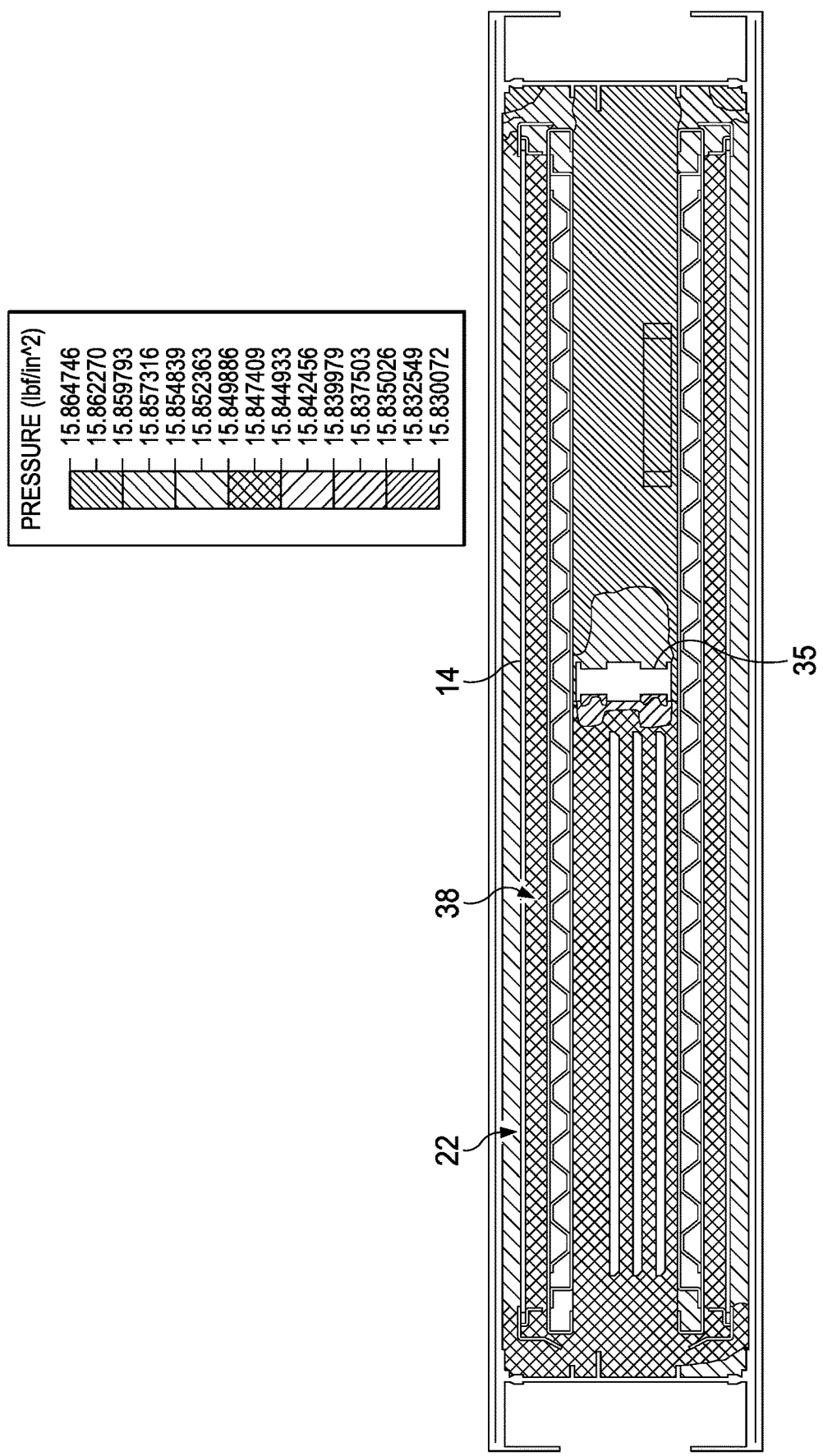
FIG. 5 is a top section view similar to FIG. 3 illustrating another exemplary pressure analysis where the display bowing is reduced or eliminated.

FIG. 4 is a top sectional view similar to FIG. 2 illustrating an exemplary pressure analysis for the display assembly 10. Similarly, FIG. 5 is a top sectional view similar to FIG. 3 illustrating an exemplary pressure analysis for the display assembly 10. FIGS. 4 and 5 demonstrate how bowing of the electronic display 14 may be reduced or eliminated. These analyses are merely exemplary and are not intended to be limiting. Any dimensions, temperatures, pressures, and the like are contemplated.

As can be seen in both FIG. 4 and FIG. 5, the pressure of the backlight cavity gas 25 located in the backlight cavity 38 is relatively low as compared to the pressure of the circulating gas 24 located in the first gas pathway 22 along the entirety of the first gas pathway 22. For example, but not to serve as a limitation, the pressure of the backlight cavity gas 25 is illustrated as green, thereby indicating a lower pressure, as compared to the pressure of the circulating gas 24 in the first gas pathway 22 which is illustrated yellow to indicate a higher pressure. The indicated pressure drop may create forces which counteract the bowing of the electronic display 14 that may otherwise occur, leading to decreased or eliminated bowing of the electronic display 14 as shown.

Figure 6:
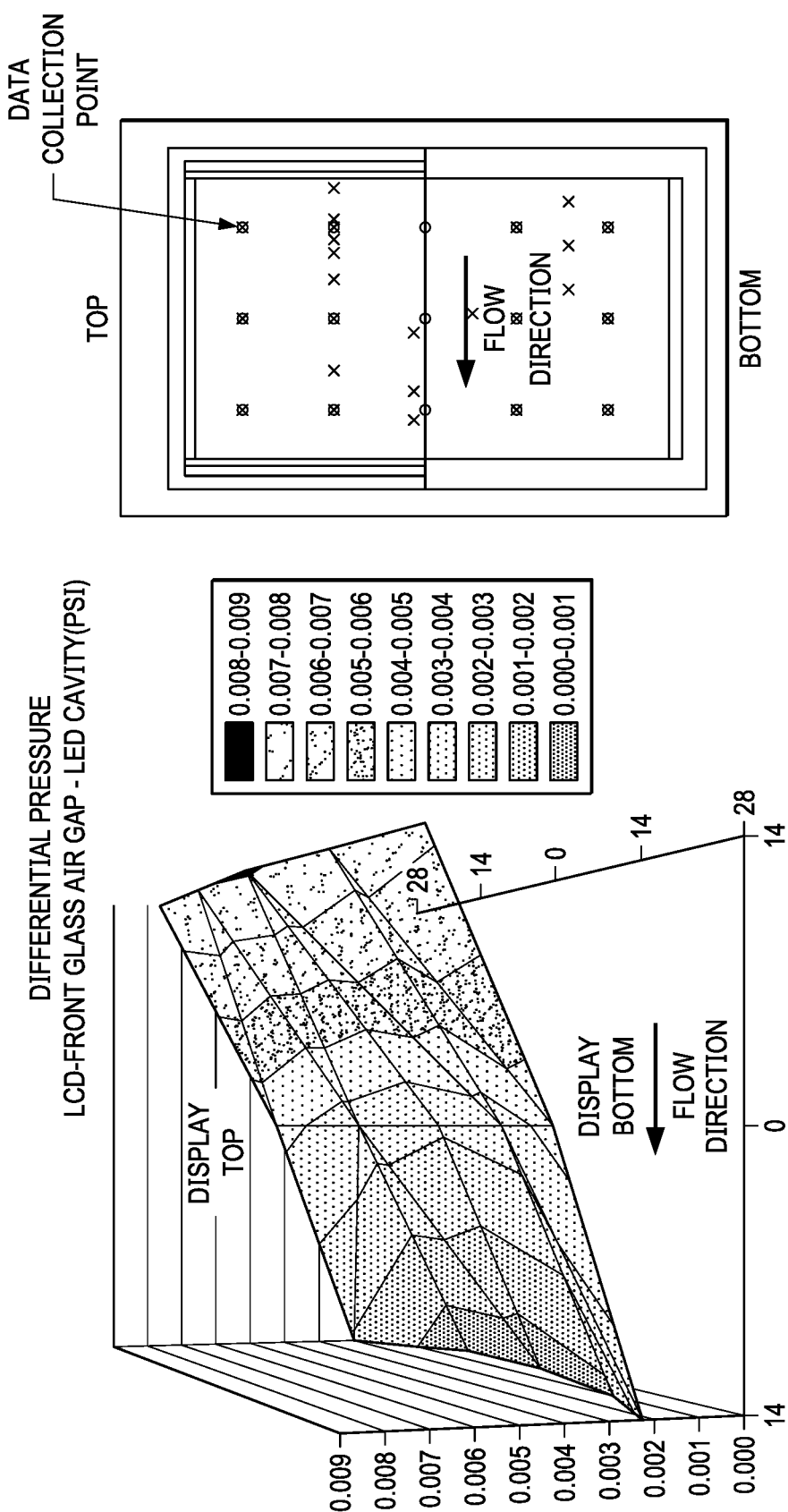
FIG. 6 is an exemplary graphical representation of another exemplary pressure analysis.

FIG. 6 is an exemplary graphical representation of another exemplary pressure analysis illustrating differential pressure between the first gas pathway 22 (also referred to as the LCD cavity, the front glass air gap, or the LCD-front glass air gap herein) and the backlight cavity 36 (also referred to as the LED cavity herein). This analysis and the results are merely exemplary and are not intended to be limiting. Any dimensions, temperatures, pressures, and the like are contemplated. The detailed data used to produce the graphical representation shown in FIG. 6 is as follows:

TABLE 1

LCD-FRONT GLASS AIR GAP DATA

| X [in] | Y [in] | Z [in] | Abs Pressure [lbf/in^2] | Temperature (Fluid) [° C.] |
|---|---|---|---|---|
| 28 | −14 | 4.25 | 15.64857752 | 80.1480277 |
| 14 | −14 | 4.25 | 15.64646607 | 79.09110465 |
| 0 | −14 | 4.25 | 15.6454628 | 75.28046445 |
| −14 | −14 | 4.25 | 15.6448872 | 75.11193992 |
| −28 | −14 | 4.25 | 15.64592538 | 73.22106961 |
| 28 | 0 | 4.25 | 15.65053391 | 76.47154539 |
| 14 | 0 | 4.25 | 15.64905628 | 76.15458164 |
| 0 | 0 | 4.25 | 15.64821219 | 72.39194399 |
| −14 | 0 | 4.25 | 15.64801795 | 71.92009026 |
| −28 | 0 | 4.25 | 15.64829522 | 69.78575356 |
| 28 | 14 | 4.25 | 15.65330566 | 72.50363672 |
| 14 | 14 | 4.25 | 15.65321209 | 71.96269658 |
| 0 | 14 | 4.25 | 15.65307815 | 67.82091386 |
| −14 | 14 | 4.25 | 15.65242712 | 67.46451856 |
| −28 | 14 | 4.25 | 15.65168999 | 65.76823918 |

TABLE 2

LED CAVITY (ABS PRESSURE PSI) DATA

| X [in] | Y [in] | Z [in] | Abs Pressure [lbf/in^2] | Temperature (Fluid) [° C.] |
|---|---|---|---|---|
| 28 | −14 | 3.37 | 15.64622021 | 87.70353149 |
| 14 | −14 | 3.37 | 15.64566772 | 87.96110944 |
| 0 | −14 | 3.37 | 15.64512518 | 91.58209795 |
| −14 | −14 | 3.37 | 15.644584 | 79.94765992 |
| −28 | −14 | 3.37 | 15.64401504 | 79.7297815 |
| 28 | 0 | 3.37 | 15.64615716 | 88.11894204 |
| 14 | 0 | 3.37 | 15.64556531 | 86.24853469 |
| 0 | 0 | 3.37 | 15.64509058 | 77.61667113 |
| −14 | 0 | 3.37 | 15.64448586 | 75.67236919 |
| −28 | 0 | 3.37 | 15.64400603 | 74.72774976 |
| 28 | 14 | 3.37 | 15.64606925 | 89.41494757 |
| 14 | 14 | 3.37 | 15.64557001 | 82.3178322 |
| 0 | 14 | 3.37 | 15.6449758 | 83.04160394 |
| −14 | 14 | 3.37 | 15.64443134 | 76.65225751 |
| −28 | 14 | 3.37 | 15.64397409 | 71.0659114 |

TABLE 3

DIFFERENTIAL PRESSURE (LCD-LED) (PSI)

| |
|---|
| 0.002357311 |
| 0.000798346 |
| 0.000337611 |
| 0.000303201 |
| 0.001910336 |
| 0.004376755 |
| 0.003490969 |
| 0.003121612 |
| 0.003532089 |
| 0.004289189 |
| 0.007236418 |
| 0.007642077 |
| 0.008102352 |
| 0.007995777 |
| 0.0077159 |

TABLE 4

CHART DATA

| | −14 | 0 | 14 |
|---|---|---|---|
| 28 | 0.002357 | 0.004377 | 0.007236 |
| 14 | 0.000798 | 0.003491 | 0.007642 |

TABLE 4-continued

CHART DATA

|  | −14 | 0 | 14 |
|---|---|---|---|
| 0 | 0.000338 | 0.003122 | 0.008102 |
| −14 | 0.000303 | 0.003532 | 0.007996 |
| −28 | 0.00191 | 0.004289 | 0.007716 |

As can be seen, the pressure of the backlight cavity gas 25 located in the backlight cavity 38 is relatively low as compared to the pressure of the circulating gas 24 located in the first gas pathway 22 along the entirety of the first gas pathway 22. The resulting pressure drop may create forces which counteract the bowing of the electronic display 14 that may otherwise occur, leading to decreased or eliminated bowing as shown in this figure. It is notable that while the pressure differential (here, a relative pressure drop) between the data points in the backlight cavity 36 and the corresponding data points in the first gas pathway 22 may be relatively small, when multiplied by the number of square inches in the corresponding electronic display 14, the resulting forces can be significant.

Figure 7B:
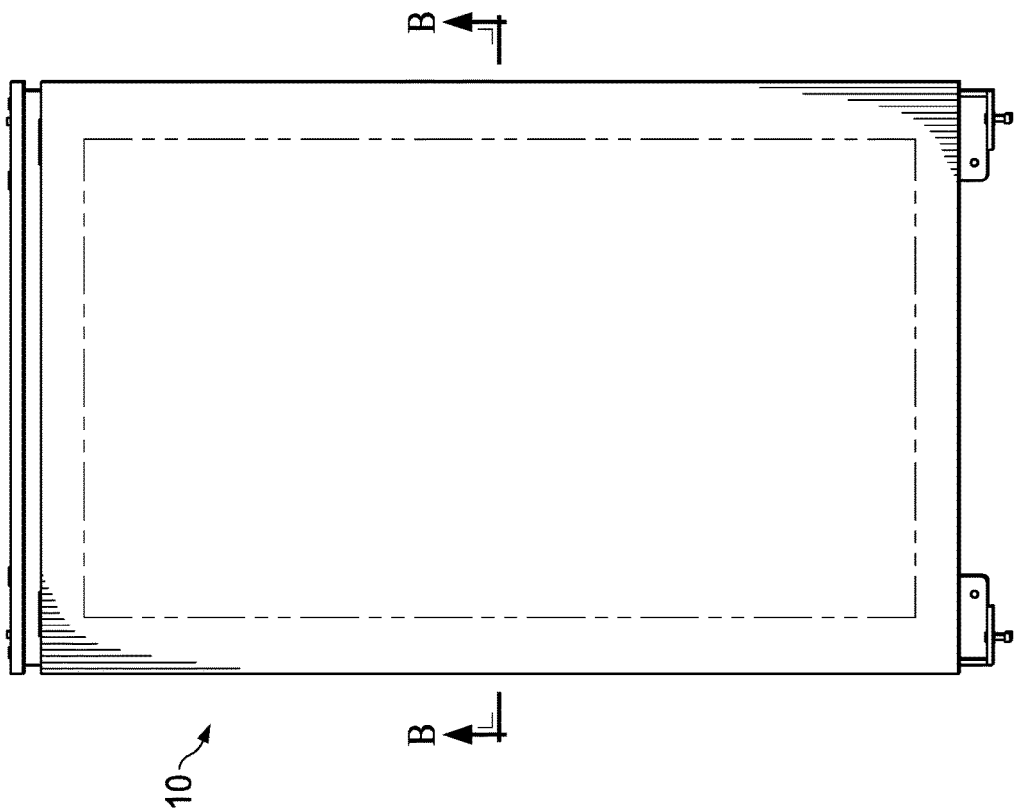
FIG. 7B is a front view of the display assembly of FIG. 7A also indicating section line B-B.
Figure 7A:
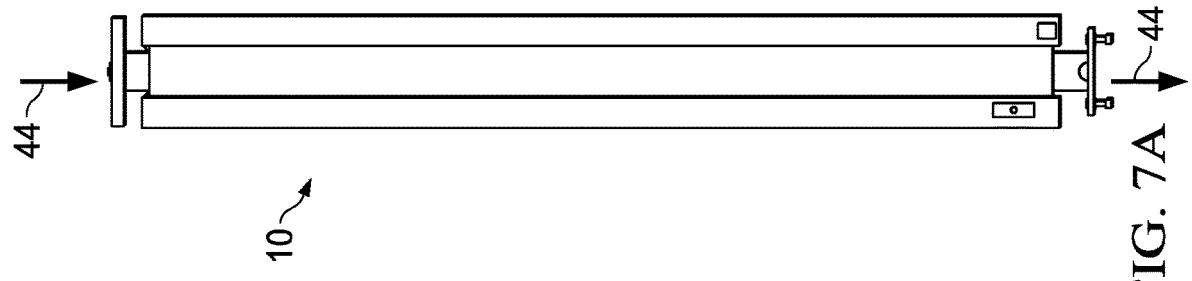
FIG. 7A is a side view of another exemplary display assembly in accordance with the present invention.
Figure 10:
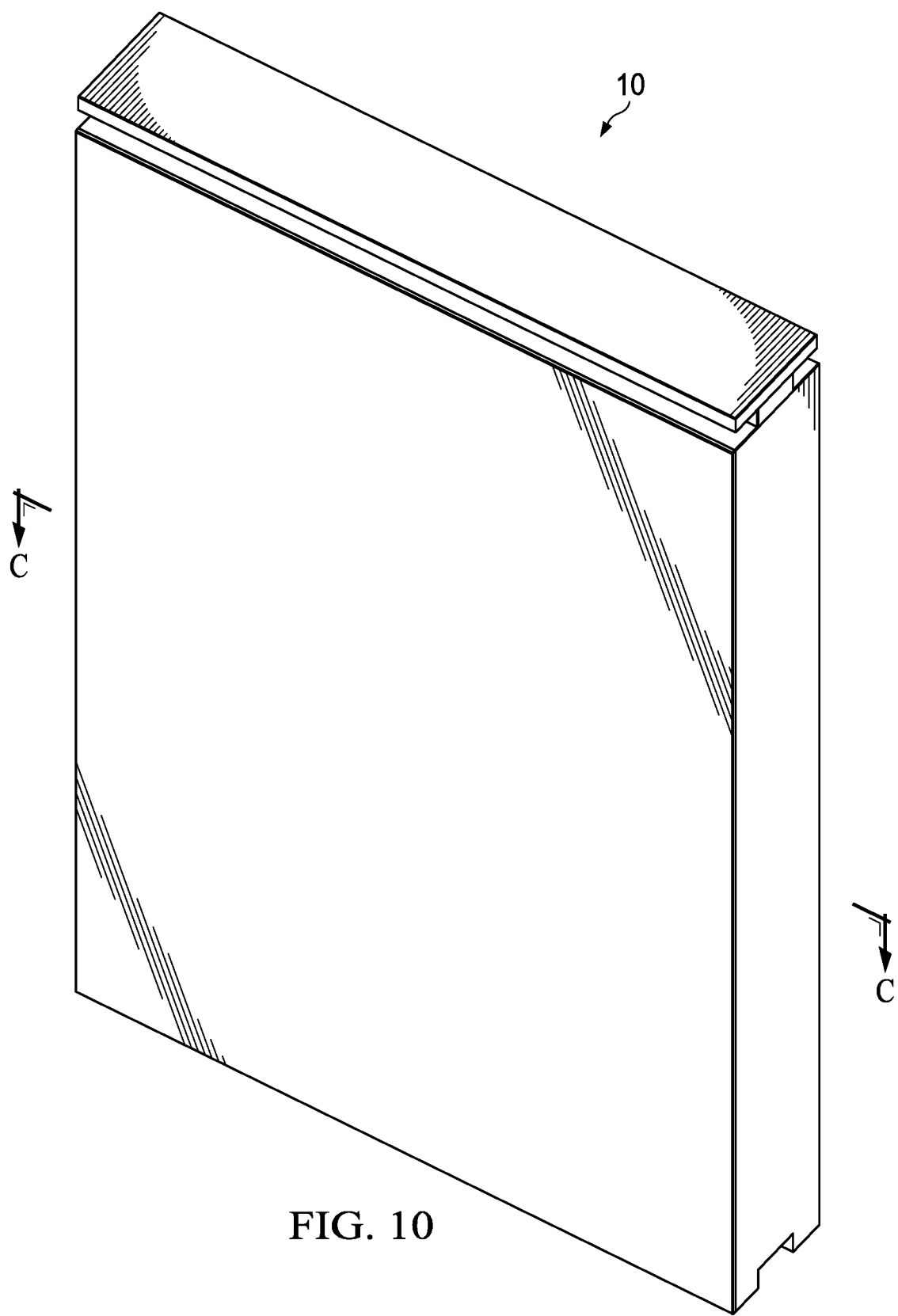
FIG. 10 is a front perspective view of another exemplary display assembly in accordance with the present invention also indicating section line C-C.
Figure 11:
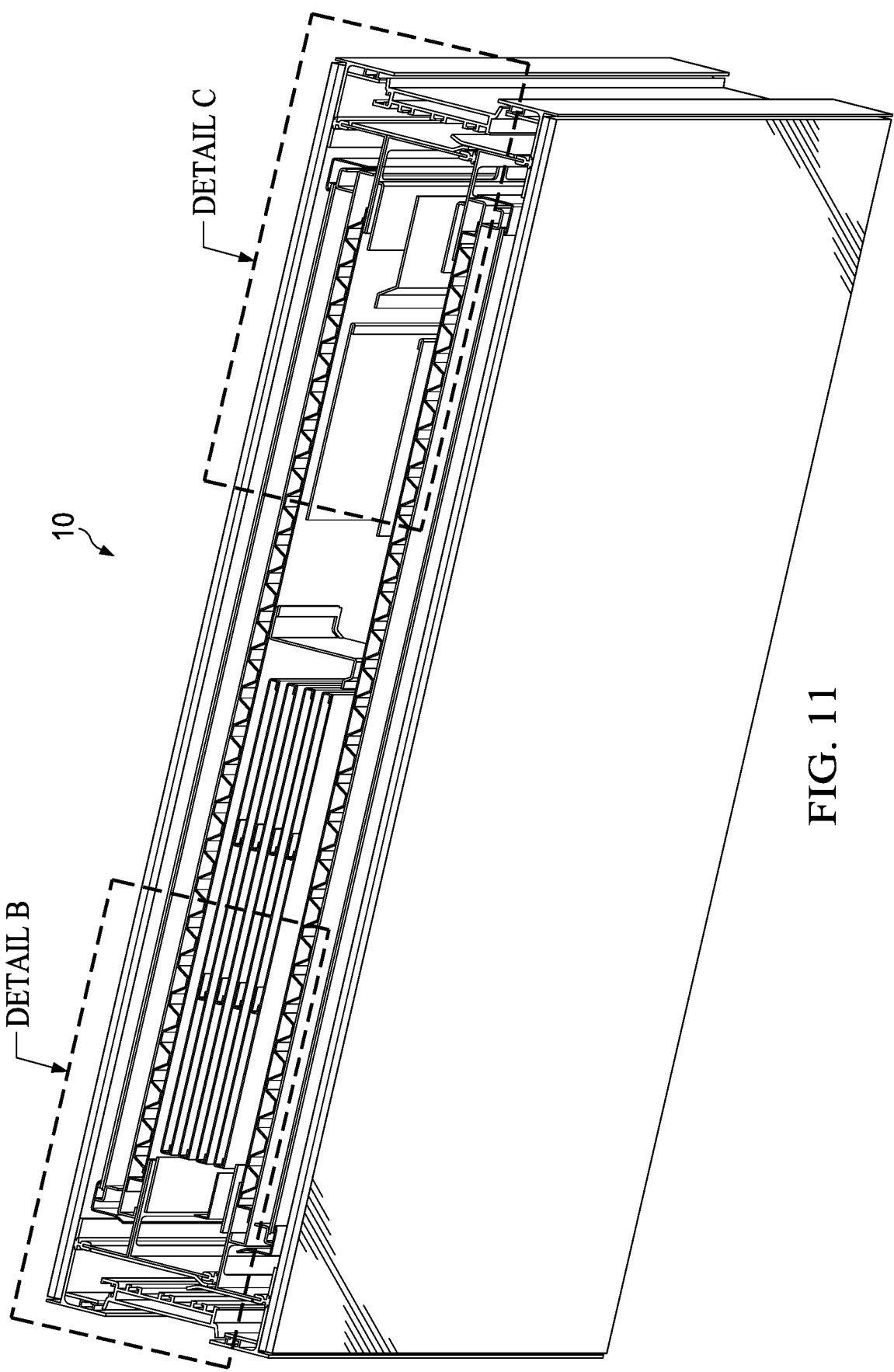
FIG. 11 is a top perspective sectional view taken along section line C-C of FIG. 10 also indicating Detail B and Detail C.
Figure 12:
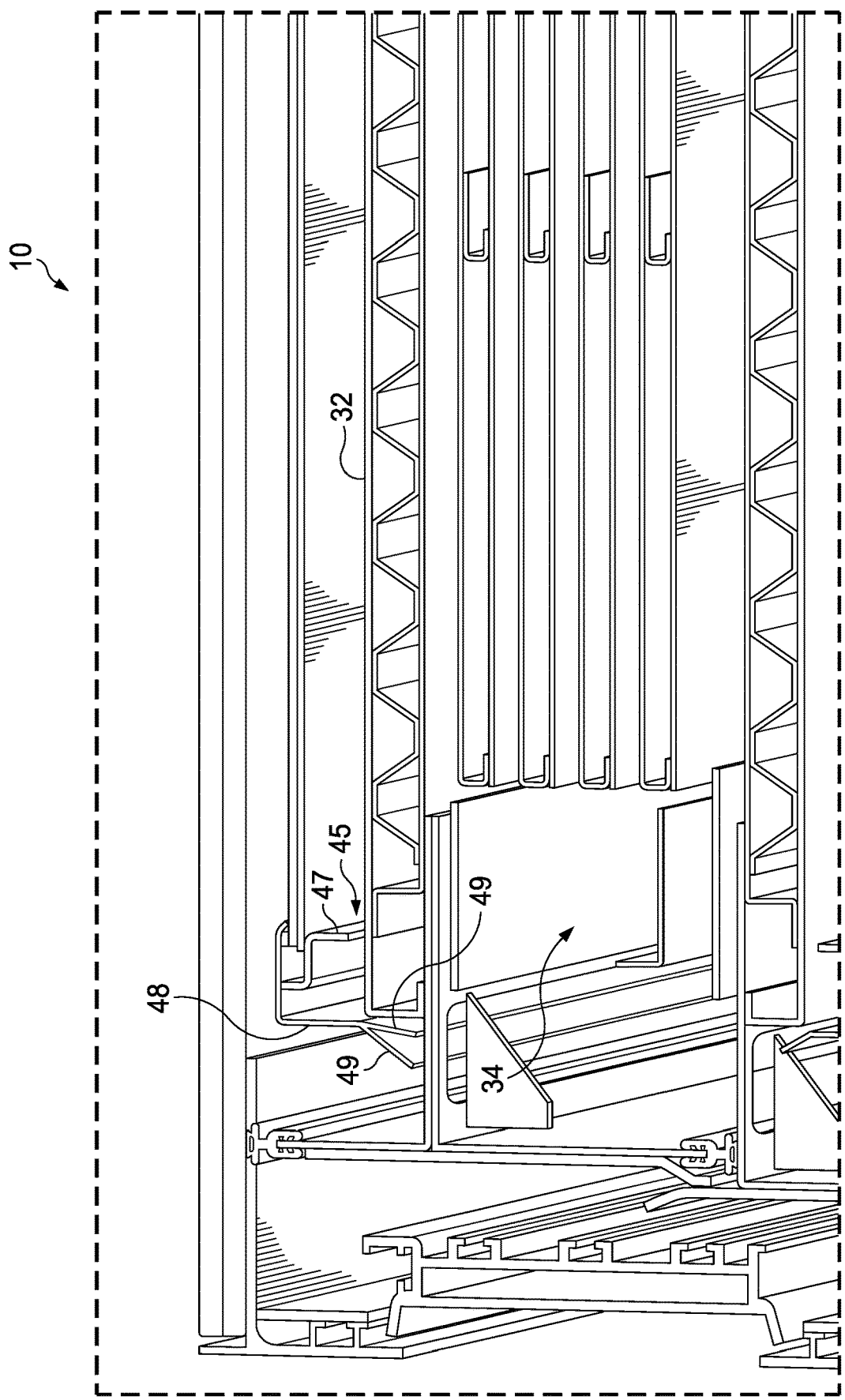
FIG. 12 is a detailed top sectional perspective view of Detail B of FIG. 11.
Figure 13:
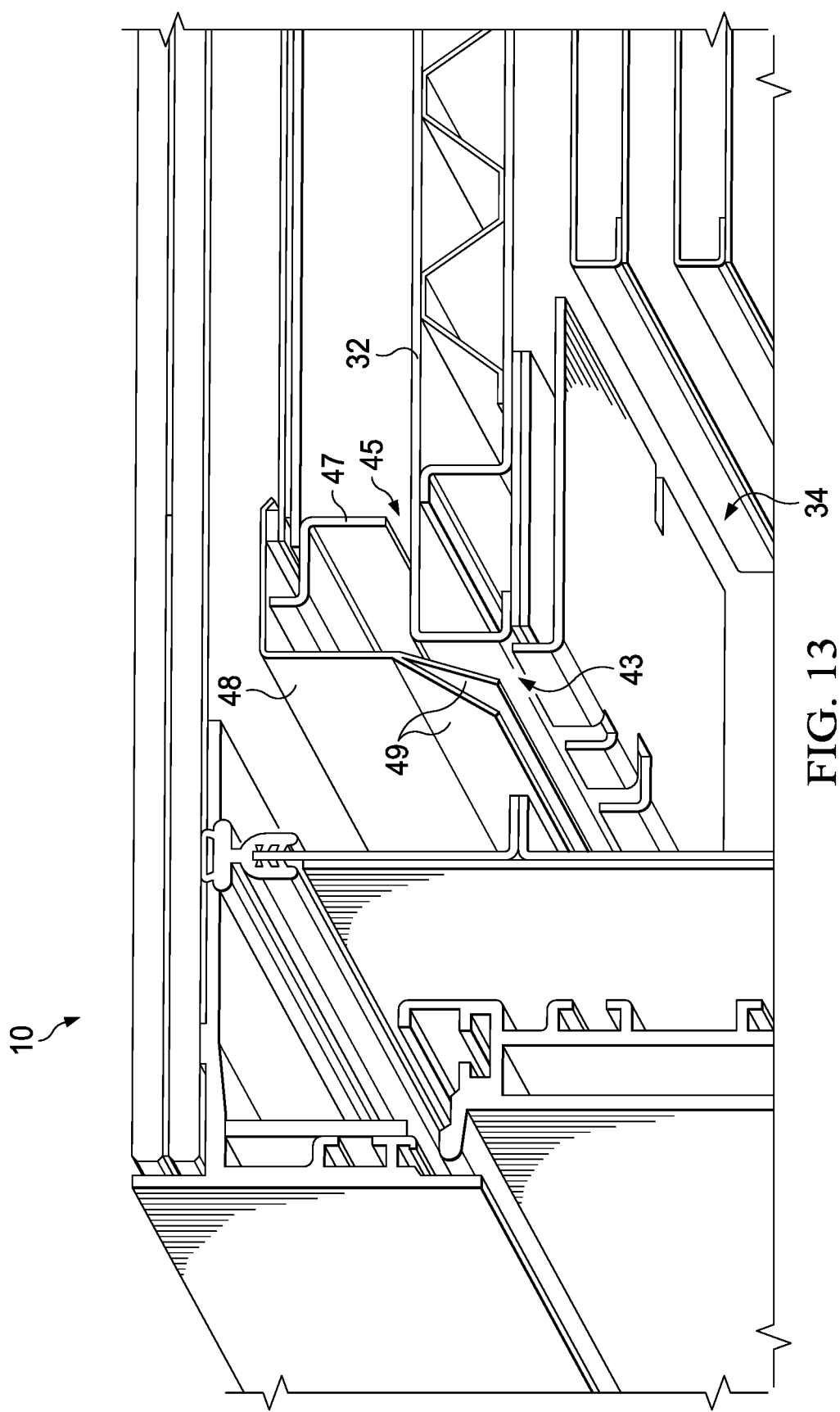
FIG. 13 provides another angle of Detail B of FIGS. 11-12.
Figure 14:
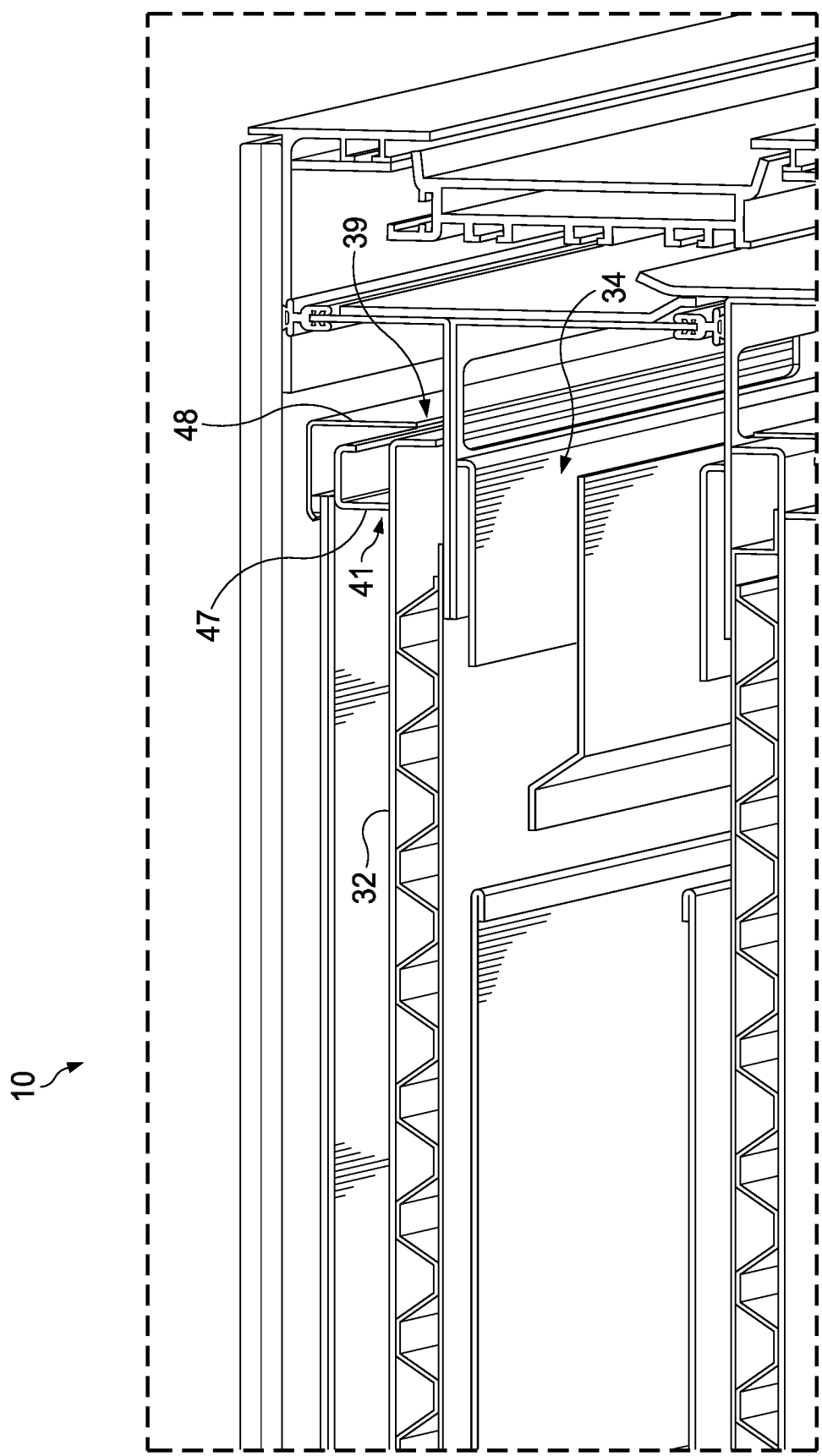
FIG. 14 is a detailed top perspective sectional view of Detail C of FIG. 11.
Figure 15:
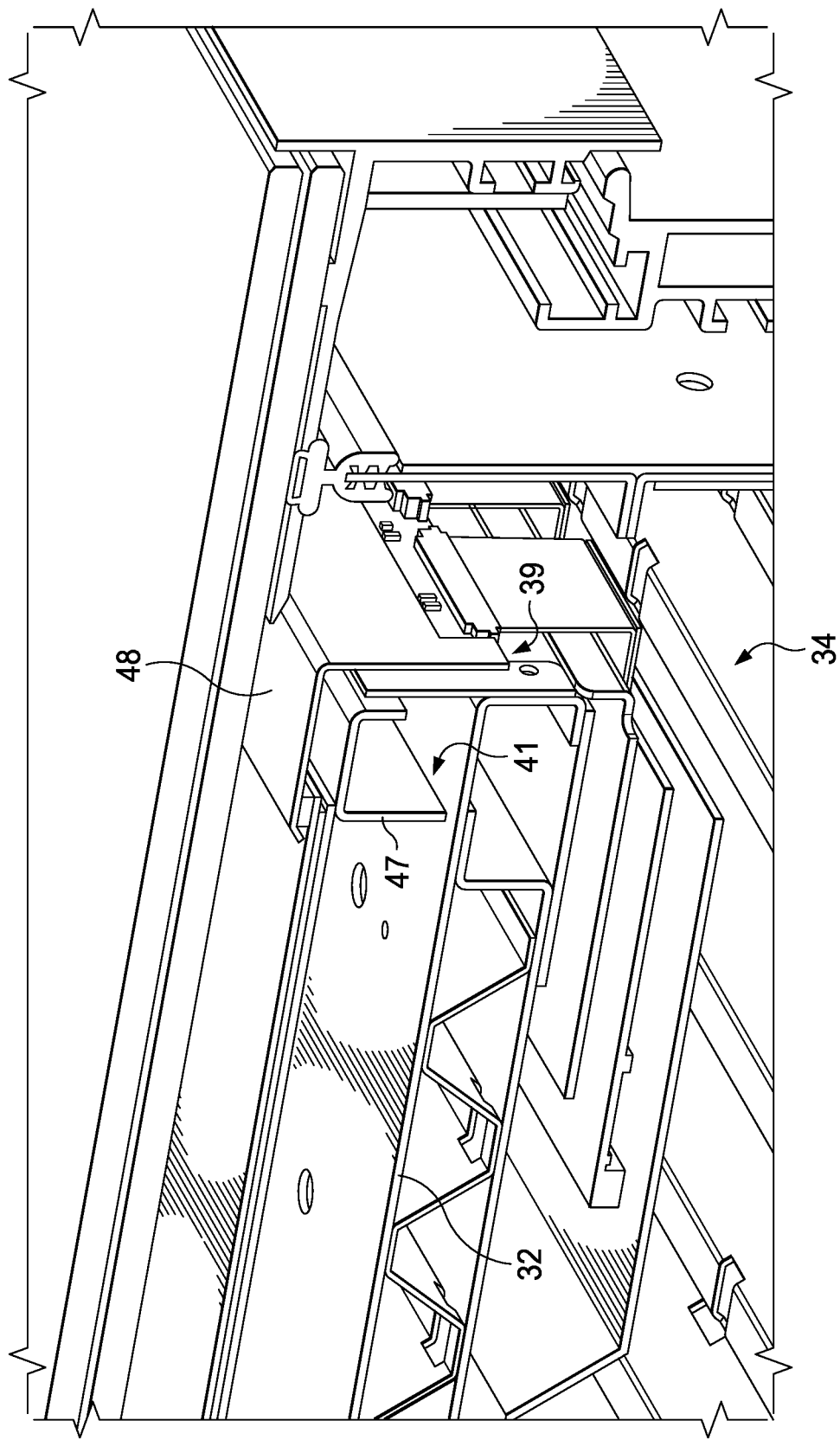
FIG. 15 is a detailed top perspective sectional view similar to FIG. 14 illustrated in greater detail and from a different angle.

FIG. 7A and FIG. 7B illustrate another exemplary display assembly 10 in accordance with the present invention. Ambient air 44 may be ingested into the top of the display assembly 10 and exhausted from the bottom of the display assembly 10, thus creating an open loop.

FIG. 8 and FIG. 9 illustrate another exemplary embodiment of the display assembly 10. As illustrated, circulating gas 24 may flow through the electronics cavity 34. A first portion of the circulating gas 24 may enter the first gas pathway 22, and a second portion of the circulating gas 24 may enter the backlight cavity 36 (i.e., the backlight cavity gas 25). The circulating gas 24 be rejoined when exiting the first gas pathway 22 and the backlight cavity 36 and returning to the electronics cavity 34, thus creating a closed loop. The electronics cavity 34 may comprise one or more heat exchangers 28, though such is not required. In exemplary embodiments, the heat exchanger 28 may comprise one or more closed loop channels 29 for the circulating gas 24. Ambient air 44 may travel through one or more of the first open loop channels 37. The ambient air 44 may also travel through one or more open loop channels 27 in the heat exchanger 28.

FIG. 10 through FIG. 15 illustrate another exemplary embodiment of the display assembly 10. This embodiment may likewise comprise supports 47, brackets 48, and an angled section 49 similar to those described herein. Multiple angled sections 49 may extend from the brackets 48.

A first exit gap 45 may be located between the support 47 and the rear plate 32. In exemplary embodiments, the second exit gap 43 may be located between a distal end of the support 47 and the front surface of the rear plate 32. A second exit gap 43 may be located between the bracket 48 and the housing 16. Alternatively, or in addition the second exit gap 43 may be located between the angled section 49 and the housing 16. In exemplary embodiments the portion of the housing 16 defining the second exit gap 43 may be a sidewall of the housing 16 which also defines a portion of the electronics cavity 34. The first exit gap 45 and the second exit gap 43 may permit the backlight cavity gas 25 to escape the backlight cavity 36 and rejoin the remainder of the circulating gas 24.

A second entrance gap 41 may be located between the support 47 and the rear plate 32. In exemplary embodiments, the second entrance gap 41 may be located between a distal end of the support 47 and the front surface of the rear plate 32. A first entrance gap 39 may be located between the brackets 48 and the housing 16. In exemplary embodiments the portion of the housing 16 defining the first entrance gap 39 may be a sidewall of the housing 16 which also defines a portion of the electronics cavity 34. The second entrance gap 41 and the first entrance gap 39 may permit a portion of the circulating gas 24 (i.e., the backlight cavity gas 25) to separate from the remainder of the circulating gas 24 and enter the backlight cavity 36.

As previously described, in exemplary embodiments the first entrance gap 39 is smaller than the second exit gap 43. In exemplary embodiments the second entrance gap 41 is smaller than the first exit gap 45. However, any size first entrance gap 39, second exit gap 43, second entrance gap 41, and first exit gap 41 is contemplated.

Figure 16:
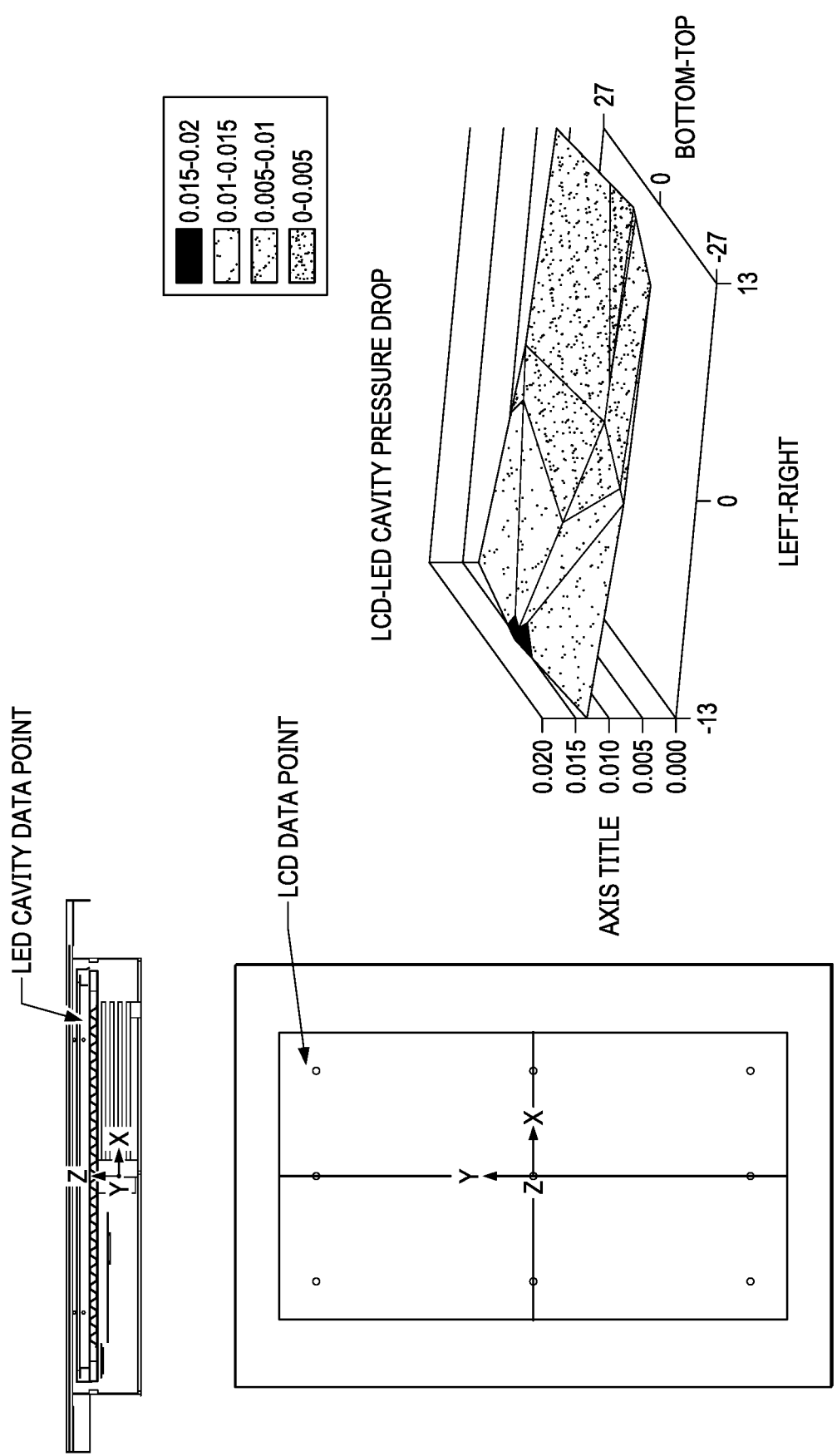
FIG. 16 is another exemplary pressure analysis similar to FIG. 6.

FIG. 16 is another exemplary pressure analysis and data output similar to FIG. 6. The detailed data used to produce the graphical representation shown in FIG. 16 is as follows:

TABLE 5

Medium - Fluid; Iteration = 376

| X [in] | Y [in] | Z [in] | Pressure [lbf/in^2] | Temperature (Fluid) [° C.] |
|---|---|---|---|---|
| −13 | −27 | 3.41 | 15.95534082 | 82.80915223 |
| −13 | 0 | 3.41 | 15.95415027 | 78.80780428 |
| −13 | 27 | 3.41 | 15.95314981 | 76.73172097 |
| 0 | −27 | 3.41 | 15.95525719 | 89.47604249 |
| 0 | 0 | 3.41 | 15.95417125 | 89.92926056 |
| 0 | 27 | 3.41 | 15.95312927 | 82.66170811 |
| 13 | −27 | 3.41 | 15.95527029 | 92.04619987 |
| 13 | 0 | 3.41 | 15.95415218 | 97.38758681 |
| 13 | 27 | 3.41 | 15.9531214 | 87.79855441 |
| −13 | −27 | 4.3 | 15.96863588 | 79.33436377 |
| −13 | 0 | 4.3 | 15.96969667 | 76.02973785 |
| −13 | 27 | 4.3 | 15.96581351 | 74.39993597 |
| 0 | −27 | 4.3 | 15.96603453 | 80.51190665 |
| 0 | 0 | 4.3 | 15.95935343 | 80.63542739 |
| 0 | 27 | 4.3 | 15.96185612 | 75.60167989 |
| 13 | −27 | 4.3 | 15.96510689 | 83.28837491 |
| 13 | 0 | 4.3 | 15.95824753 | 80.84146671 |
| 13 | 27 | 4.3 | 15.96025992 | 77.61727691 |

Figure 17:
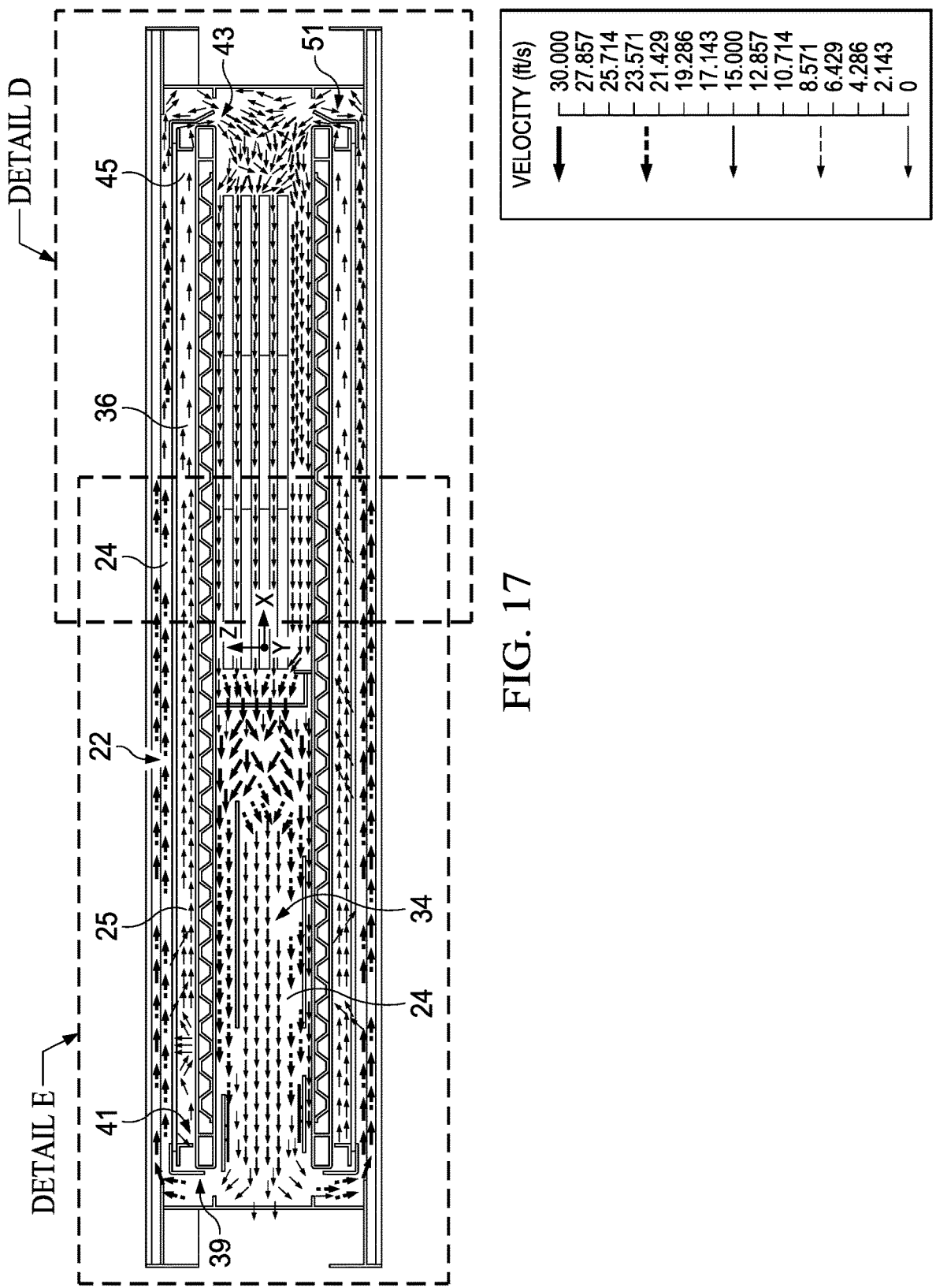
FIG. 17 is a top sectional view similar to FIG. 11 showing an exemplary air flow velocity analysis also indicating Detail D and Detail E.
Figure 18:
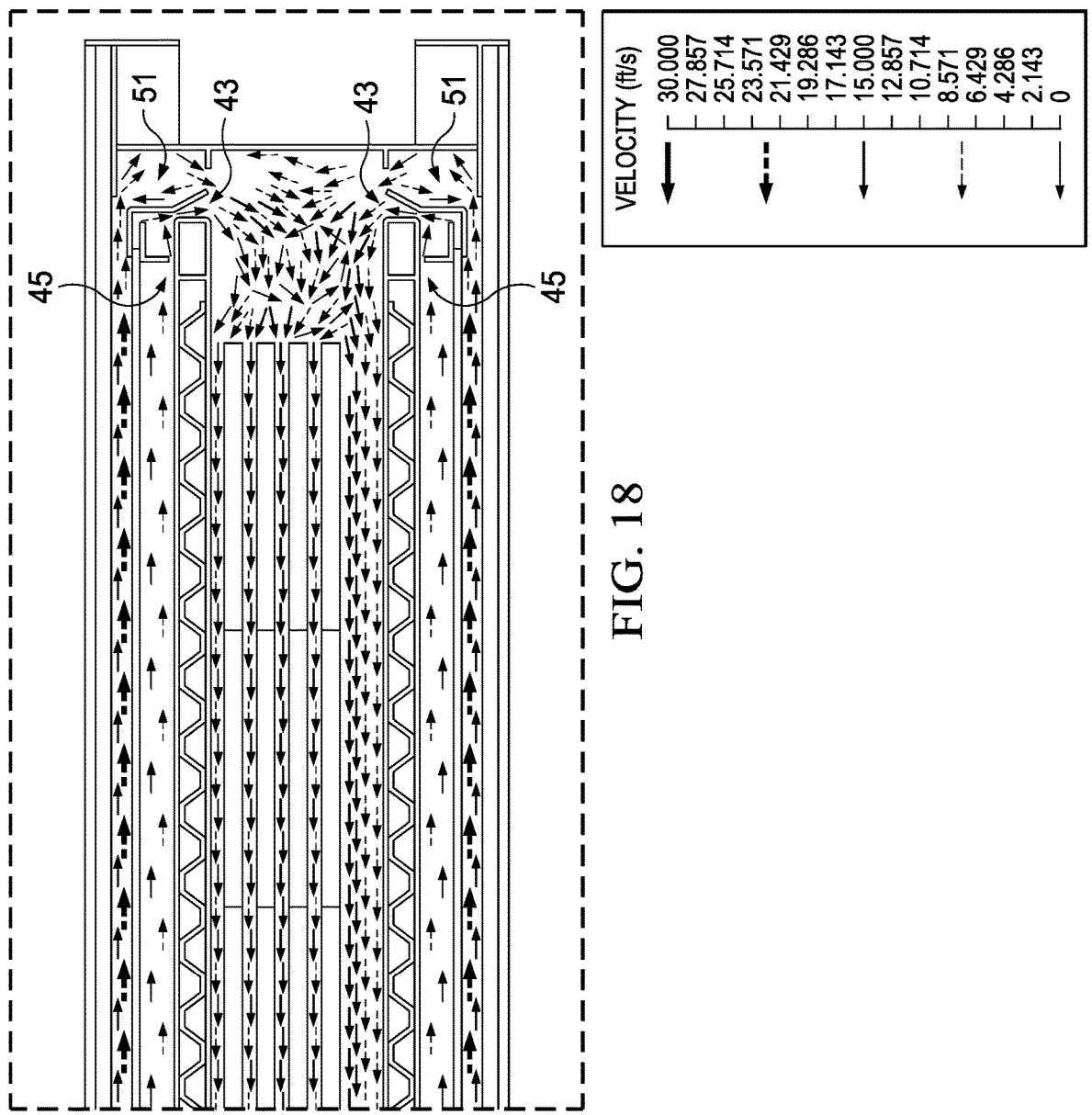
FIG. 18 is a detailed top sectional view of Detail D of FIG. 17.
Figure 19:
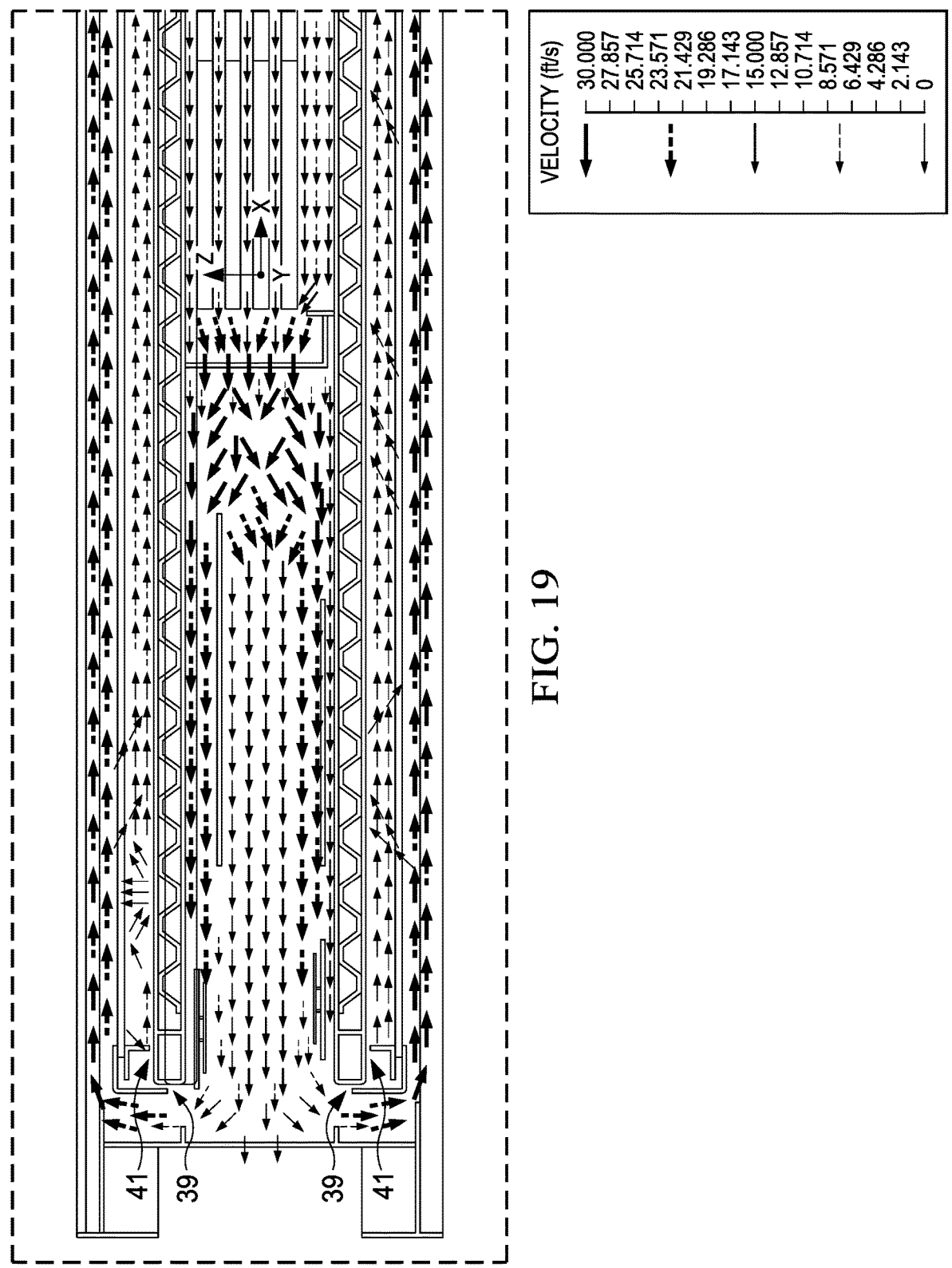
FIG. 19 is a detailed top sectional view of Detail E of FIG. 17.

FIG. 17 through FIG. 19 illustrate an exemplary air flow velocity analysis for the display assembly 10. As can be seen in these figures, a portion of the circulating gas 24 (i.e., the backlight cavity gas 25) may enter the backlight cavity 36 and travel therethrough at generally a relatively lower velocity as compared to the circulating gas 24 traveling through the first gas pathway 22. Also, the angled sections 49 may create an eddy of circulating gas 24 in an area 51 around the angled sections 49 resulting in slowed circulating gas 24 exiting the area 51. Regardless, this area 51 may comprise circulating gas at a relatively low pressure as compared to the circulating gas 24 in the surrounding area. The illustrated analysis is merely exemplary and is not intended to be limiting.

Although the flow of the ambient air 44 and the circulating gas 24 may be shown and described herein with respect to particular directions and orientations, it is contemplated that the ambient air 44 and the circulating gas 24 may flow in other directions. For example, without limitation, ambient air 44 and circulating gas 24 shown as flowing clockwise may flow counter-clockwise, when shown flowing vertically from top to bottom may flow from bottom to top, when shown flowing horizontally from right to left may flow from left to right, when shown flowing vertically may flow horizontally, when shown flowing horizontally may flow vertically, and the like.

Any embodiment of the present invention may include any of the optional or preferred features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

What is claimed is:

1. An apparatus for reducing or combating bowing of an electronic display layer, said apparatus comprising:
    a cover panel, wherein the electronic display layer is located behind said cover panel;
    a rear panel positioned behind the electronic display layer; and
    a closed loop pathway for circulating gas comprising:
        a first gas pathway located between said cover panel and the electronic display layer;
        a cavity located between the electronic display layer and the rear panel; and
        a second gas pathway located behind the rear panel;
    wherein the closed loop pathway is configured to cause the pressure of circulating gas in the cavity to be lower than the pressure of circulating gas in the first gas pathway.

2. The apparatus of claim 1 further comprising:
a number of illumination devices located on the rear panel to illuminate the electronic display layer.

3. The apparatus of claim 1 further comprising:
a number of illumination devices positioned to edge light the electronic display layer.

4. The apparatus of claim 1 further comprising:
an open loop pathway for ambient air located behind said rear panel.

5. The apparatus of claim 4 further comprising:
a second rear panel located behind said rear panel;
a corrugated layer extending between said second rear panel and said rear panel; and
a first open loop pathway, forming at least part of said open loop pathway, located between said rear panel and said second rear panel.

6. The apparatus of claim 5 further comprising:
a heat exchanger located along the second gas pathway; and
a second open loop pathway, forming at least part of said open loop pathway, comprising said heat exchanger.

7. The apparatus of claim 1 further comprising:
an entrance gap located at an entrance to the cavity; and
an exit gap located at an exit from the cavity, wherein the entrance gap is smaller than the exit gap.

8. The apparatus of claim 1 further comprising:
a first airflow modification device associated with an entrance to the cavity and configured to create an entrance gap; and
a second airflow modification device associated with an exit from the cavity, and configured to create an exit gap, wherein the entrance gap is smaller than the exit gap.

9. The apparatus of claim 8 further comprising:
a housing for the electronic display layer, wherein the second airflow modification device comprises an angled section which extends towards a side of said housing.

10. The apparatus of claim 9 wherein:
the angled section is configured to create a venturi effect.

11. The apparatus of claim of 1 wherein:
the pressure of the circulating gas passing through the cavity is between 0 and 0.5 psi lower than the circulating gas passing through the first gas pathway.

12. The apparatus of claim 1 wherein:
the electronic display layer comprises liquid crystals.

13. The apparatus of claim 2 wherein:
each of the number of illumination devices comprise one or more LEDs.

14. A method for reducing or combating bowing of an electronic display layer, said method comprising the steps of:
    providing a cover panel, wherein the electronic display layer is located behind said cover panel, a rear panel positioned behind the electronic display layer, and a closed loop pathway for circulating gas comprising a first gas pathway located between said cover panel and the electronic display layer, a cavity located between the electronic display layer and the rear panel, and a second gas pathway located behind the rear panel;
    causing circulating gas to flow through the first gas pathway at a first pressure; and
    causing circulating gas to flow through the cavity at a second pressure, wherein the second pressure is lower than the first pressure.

15. The method of claim 14 further comprising the steps of:
    providing an airflow modification device at an entrance to the cavity, wherein the airflow modification device is configured to cause a pressure drop in circulating gas flowing through the cavity relative to circulating gas flowing through the first gas pathway.

16. The method of claim 14 further comprising the steps of:
    providing an airflow modification device at an exit to the cavity, wherein the airflow modification device is configured to cause a pressure drop in circulating gas flowing through the cavity relative to circulating gas flowing through the first gas pathway.

17. The method of claim 14 wherein:
the first pressure is no more than 0.5 psi greater than the second pressure.

18. The method of claim 14 wherein:
the rear panel is a backlight comprising a number of LEDs for illuminating the electronic display layer.

19. An apparatus for reducing or combating bowing of an electronic display layer, said apparatus comprising:
    a cover panel, wherein the electronic display layer is located behind said cover panel;
    a rear panel positioned behind the electronic display layer; and
    an air pathway comprising:
        a first gas pathway located between said cover panel and the electronic display layer;
        a cavity located between the electronic display layer and the rear panel; and
        a second gas pathway located behind the rear panel;
    wherein the air pathway is configured to cause the pressure of air in the cavity to be lower than the pressure of air in the first gas pathway.

20. The apparatus of claim 19 wherein:
the air pathway forms a closed loop.

* * * * *

UNITED STATES PATENT AND TRADEMARK OFFICE
CERTIFICATE OF CORRECTION

PATENT NO. : 10,757,844 B2
APPLICATION NO. : 16/502515
DATED : August 25, 2020
INVENTOR(S) : William Dunn et al.

Page 1 of 1

It is certified that error appears in the above-identified patent and that said Letters Patent is hereby corrected as shown below:

On the Title Page

Item (56) In the References Cited:
Page 2, Column 2, Reference No. 7,480,140, please delete "Nara et al." and insert -- Hara et al. --

Signed and Sealed this
Twentieth Day of October, 2020

Andrei Iancu
*Director of the United States Patent and Trademark Office*